United States Patent
Kim et al.

(10) Patent No.: US 12,050,752 B2
(45) Date of Patent: Jul. 30, 2024

(54) DISPLAY DEVICE

(71) Applicant: Samsung Display Co., Ltd., Yongin-si (KR)

(72) Inventors: Hyunwoong Kim, Gwangmyeong-si (KR); Kwang-min Kim, Seoul (KR); Kiwook Kim, Hwaseong-si (KR); Yangwan Kim, Hwaseong-si (KR); Jisu Na, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/077,163

(22) Filed: Dec. 7, 2022

(65) Prior Publication Data

US 2023/0104063 A1 Apr. 6, 2023

Related U.S. Application Data

(63) Continuation of application No. 16/551,641, filed on Aug. 26, 2019, now Pat. No. 11,550,437.

(30) Foreign Application Priority Data

Oct. 24, 2018 (KR) .................. 10-2018-0127515
Nov. 22, 2018 (KR) .................. 10-2018-0145486

(51) Int. Cl.
*G06F 3/044* (2006.01)
*H10K 59/40* (2023.01)

(52) U.S. Cl.
CPC .......... *G06F 3/0446* (2019.05); *G06F 3/0443* (2019.05); *H10K 59/40* (2023.02); *G06F 2203/04111* (2013.01)

(58) Field of Classification Search
None
See application file for complete search history.

(56) References Cited

U.S. PATENT DOCUMENTS 10,192,938 B2   1/2019   Yu et al.
10,361,254 B2   7/2019   Park et al.
(Continued)

FOREIGN PATENT DOCUMENTS

EP   3285137   2/2018
EP   3598280   1/2020
(Continued)

OTHER PUBLICATIONS

Extended European Search Report dated Mar. 11, 2020, issued in the European Application No. 19204923.

(Continued)

*Primary Examiner* — Brian M Butcher
(74) *Attorney, Agent, or Firm* — Lewis Roca Rothgerber Christie LLP

(57) ABSTRACT

A display device including a display panel and an input sensor including a sensing region and a wiring region, the input sensor including a first sensing electrode, a second sensing electrode, a first signal line electrically connected to a first end of the first sensing electrode, a second end thereof being electrically isolated, and second and third signal lines electrically connected to ends of the second sensing electrode, respectively, in which a total distance between the ends of the second sensing electrode is greater than that between the ends of the first sensing electrode, the second sensing electrode includes sensor parts formed from a same layer as the first sensing electrode and bridge patterns formed from a different layer from the sensor parts, and each of the first end and the second end of the second sensing electrode is configured to receive a sinusoidal signal.

7 Claims, 28 Drawing Sheets

(56) References Cited

U.S. PATENT DOCUMENTS

| | | | |
|---|---|---|---|
| 11,550,437 B2 * | 1/2023 | Kim | ........................ H10K 59/40 |
| 2013/0033450 A1 | 2/2013 | Coulson et al. | |
| 2015/0185914 A1 | 7/2015 | Han et al. | |
| 2016/0034066 A1 | 2/2016 | Nah et al. | |
| 2016/0299597 A1 | 10/2016 | Yoo et al. | |
| 2016/0320885 A1 | 11/2016 | Kim et al. | |
| 2017/0075472 A1 | 3/2017 | Min et al. | |
| 2017/0162637 A1 | 6/2017 | Choi et al. | |
| 2018/0005585 A1 | 1/2018 | Kim | |
| 2018/0129352 A1 | 5/2018 | Kim et al. | |
| 2018/0143720 A1 | 5/2018 | Kim et al. | |
| 2018/0211082 A1 | 7/2018 | Choi et al. | |
| 2018/0224984 A1 | 8/2018 | Kim et al. | |
| 2018/0284926 A1 | 10/2018 | Kim et al. | |
| 2020/0027929 A1 | 1/2020 | Lee et al. | |

FOREIGN PATENT DOCUMENTS

| | | |
|---|---|---|
| KR | 10-2015-0066860 | 6/2015 |
| KR | 10-2015-0074498 | 7/2015 |
| KR | 10-2016-0120401 | 10/2016 |
| KR | 10-2017-0031303 | 3/2017 |
| KR | 10-2017-0066767 | 3/2017 |
| KR | 10-2017-0096565 | 8/2017 |
| KR | 10-2018-0050372 | 5/2018 |
| KR | 10-2018-0052830 | 5/2018 |
| KR | 10-2018-0086604 | 8/2018 |
| KR | 10-2018-0090936 | 8/2018 |
| KR | 10-1891763 | 8/2018 |
| KR | 10-2018-0112185 | 10/2018 |

OTHER PUBLICATIONS

Non-Final Office Action dated May 14, 2020, issued to U.S. Appl. No. 16/551,641.
Final Office Action dated Oct. 28, 2020, issued to U.S. Appl. No. 16/551,641.
Non-Final Office Action dated Mar. 17, 2021, issued to U.S. Appl. No. 16/551,641.
Final Office Action dated Sep. 16, 2021, issued to U.S. Appl. No. 16/551,641.
Non-Final Office Action dated Apr. 28, 2022, issued to U.S. Appl. No. 16/551,641.
Notice of Allowance dated Oct. 25, 2022, issued to U.S. Appl. No. 16/551,641.

* cited by examiner

DISPLAY DEVICE

CROSS-REFERENCE TO RELATED APPLICATIONS

This application is a Continuation of U.S. patent application Ser. No. 16/551,641, filed on Aug. 26, 2019, which claims priority from and the benefit of Korean Patent Application Nos. 10-2018-0127515, filed on Oct. 24, 2018, and 10-2018-0145486, filed on Nov. 22, 2018, each of which is hereby incorporated by reference for all purposes as if fully set forth herein.

BACKGROUND

Field

Exemplary embodiments of the invention relate generally to a display device, and more specifically, to a display device including an input sensor.

Discussion of the Background

Various display devices for use in multimedia devices, such as televisions, mobile phones, tablet computers, navigators, game machines, and the like are being developed. Input devices of display devices generally include a keyboard, a mouse, and the like. Furthermore, display devices may include a touch panel as an input device.

The above information disclosed in this Background section is only for understanding of the background of the inventive concepts, and, therefore, it may contain information that does not constitute prior art.

SUMMARY

Display devices constructed according to embodiments of the invention include an input sensor with improved sensitivity.

Additional features of the inventive concepts will be set forth in the description which follows, and in part will be apparent from the description, or may be learned by practice of the inventive concepts.

A display device according to an embodiment includes a display panel, and an input sensor disposed on the display panel and including a sensing region and a wiring region outside the sensing region, the input sensor including signal line groups arranged in the wiring region, and first sensing electrodes and second sensing electrodes disposed in the sensing region, each of the first sensing electrodes and second sensing electrodes having one end electrically connected to a corresponding signal line of the signal line groups, in which the second sensing electrodes have a greater length than the first sensing electrodes, the signal line groups include a first signal line group electrically connected to the first sensing electrodes and a second signal line group electrically connected to the second sensing electrodes, each of the first sensing electrodes includes first bridge patterns overlapping the second sensing electrodes and disposed on a different layer from the second sensing electrodes, and one of the first sensing electrodes or the second sensing electrodes are configured to receive a sinusoidal signal.

The other one of the first sensing electrodes and the second sensing electrodes may be configured to provide a sensing signal corresponding to the sinusoidal signal to a sensing circuit.

Each of the second sensing electrodes may have a single body shape.

The display panel may include a display region corresponding to the sensing region and a non-display region corresponding to the wiring region, the display region may include light emission regions and non-light emission regions, and each of the first sensing electrodes may have openings that correspond to the light emission regions.

At least a portion of the corresponding signal line of the signal line groups may be disposed on the same layer as the second sensing electrodes.

The input sensor may further include an insulating layer disposed between the first bridge patterns and the second sensing electrodes and covering the sensing region.

The first signal line group may include first side signal lines electrically connected to odd-numbered sensing electrodes among the first sensing electrodes, and second side signal lines electrically connected to even-numbered sensing electrodes among the first sensing electrodes, and the first and second signal lines may be spaced apart from each other with the sensing region therebetween along an extension direction of the first sensing electrodes.

The input sensor may further include first dummy patterns respectively arranged inside the first sensing electrodes, and second dummy patterns respectively arranged inside the second sensing electrodes.

The input sensor may further include second bridge patterns connecting the first dummy patterns.

At least one of the first dummy patterns may include a center part and extension parts arranged on both sides of the center part along an extension direction of the first sensing electrodes, and each of the extension parts may be connected to a corresponding second bridge pattern among the second bridge patterns.

The first bridge patterns and the second bridge patterns may be disposed on the same layer.

The second bridge patterns may be arranged in correspondence with the first bridge patterns, and the second bridge patterns may have a greater length than a corresponding first bridge pattern among the first bridge patterns.

The input sensor may further include a dummy signal line connected to an outermost first dummy pattern among the first dummy patterns along an extension direction of the first sensing electrodes.

The input sensor may further include third bridge patterns intersecting the dummy signal line and insulated from the dummy signal line, and the third bridge patterns may connect the first sensing electrodes and signal lines of the first signal line group.

The display device may further include a notch region recessed inwardly in a plan view.

The display panel may include a base layer, a circuit element layer disposed on the base layer, a display element layer disposed on the circuit element layer, and an upper insulating layer disposed on the display element layer, and the display device may further include a signal transmission region in which at least a part of the base layer, the circuit element layer, the display element layer, and the upper insulating layer is removed.

A display device according to another embodiment includes a display panel and an input sensor disposed on the display panel, the input sensor including a first sensing electrode and a second sensing electrode intersecting the first sensing electrode and having a greater length than the first sensing electrode, in which the first sensing electrode includes sensor parts disposed on the same layer as the second sensing electrode, and bridge patterns disposed on a different layer from the second sensing electrode, at least one of the bridge patterns overlapping the second sensing electrode, and one of the first sensing electrode or the second sensing electrode is configured to receive a sinusoidal signal through one end thereof.

A display device according to yet another embodiment includes a display panel and an input sensor disposed on the display panel, the input sensor including an insulating layer, a first sensing electrode, and a second sensing electrode intersecting the first sensing electrode, having a greater length than the first sensing electrode, and having a single body shape, in which the first sensing electrode includes first parts disposed on the insulating layer, and second parts disposed under the insulating layer and connected to the first parts through contact holes penetrating the insulating layer, and one of the first sensing electrode or the second sensing electrode is configured to receive a sinusoidal signal through one end thereof.

The second sensing electrode may be disposed on the insulating layer.

A first end of the second sensing electrode may be connected to a signal line and a second end thereof is electrically isolated.

It is to be understood that both the foregoing general description and the following detailed description are and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
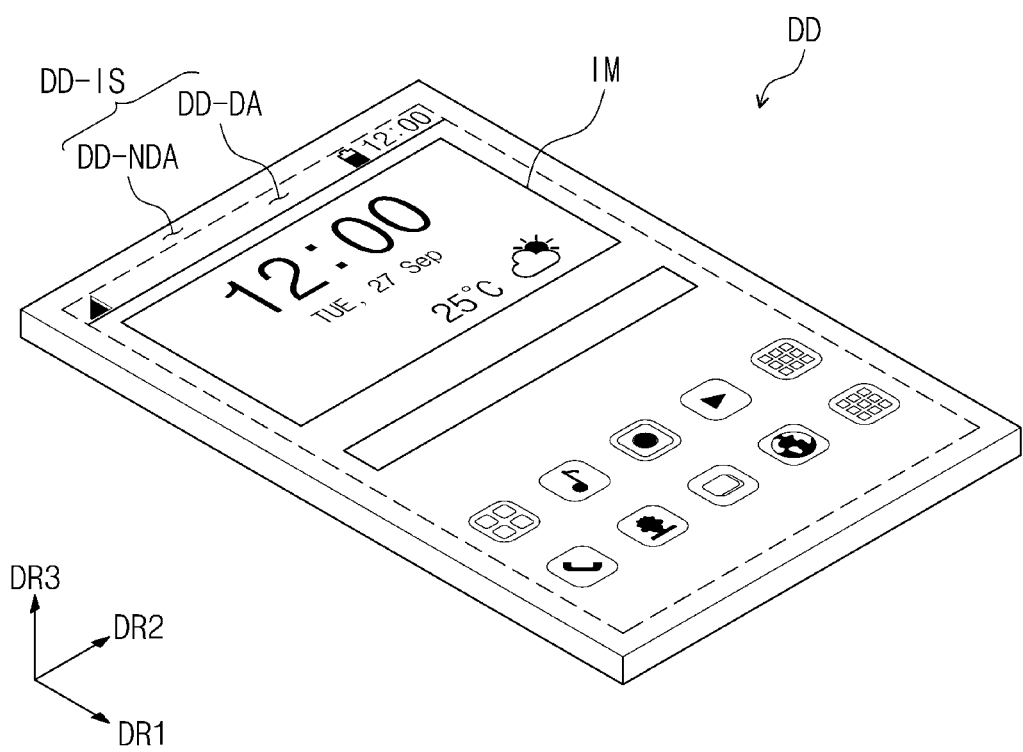
FIG. 1 is a perspective view of a display device according to an embodiment of the inventive concept.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a perspective view of a display device DD according to an embodiment of the inventive concept.

As illustrated in FIG. 1, the display device DD may display an image IM through a display surface DD-IS. The display surface DD-IS is substantially parallel to a plane defined by a first direction axis DR1 and a second direction axis DR2. A normal direction of the display surface DD-IS, e.g., a thickness direction of the display device DD, is indicated by a third direction axis DR3.

Front surfaces (or top surfaces) and rear surfaces (or bottom surfaces) of each member or unit described below are defined by the third direction axis DR3. However, the first to third direction axes DR1 to DR3 are merely exemplary, and may be varied in some embodiments. Hereinafter, first to third directions which are indicated by the first to third direction axes DR1 to DR3 are referred to by the same reference symbols.

In an embodiment, the display device DD is illustrated as having a flat display surface DD-IS, but the inventive concepts are not limited thereto. For example, the display device DD may include a curved display surface or a three-dimensional display surface. The three-dimensional display surface may include a plurality of display regions indicating different directions, and may include, for example, a polygonal column-type display surface.

The display device may be a rigid display device. However, the inventive concepts are not limited thereto, and the display device DD in some embodiments may be a flexible display device DD. The flexible display device DD may include a foldable display device or a bendable display device which is partially bent.

The display device DD according to the illustrated embodiment is shown to be applicable to a cell phone, for example. Although not illustrated, electronic modules, a camera module, a power supply module, etc., mounted on a main board may be arranged in a bracket/case or the like together with the display device DD to provide the cell phone. Furthermore, the display device DD in some embodiments may be applied to a large-size electronic device, such as a television, a monitor, or the like, or a small- or medium-size electronic device, such as a tablet, a vehicle navigator, a game machine, a smart watch, or the like.

As illustrated in FIG. 1, the display surface DD-IS includes an image region DD-DA, in which the image IM is displayed, and a bezel region DD-NDA adjacent to the image region DD-DA. An image is not displayed in the bezel region DD-NDA. FIG. 1 illustrates icon images as an example of the image IM.

As illustrated in FIG. 1, the image region DD-DA may be substantially rectangular. As used herein, the term "substantially rectangular" refers to a geometric rectangular shape as well as a rectangular shape having curved boundaries in vertex regions thereof (or corner regions).

The bezel region DD-NDA may surround the image region DD-DA. However, the inventive concepts are not limited thereto, and a shape of the image region DD-DA and a shape of the bezel region DD-NDA may be relatively designed.

FIGS. 2A to 2D are cross-sectional views of the display device DD according to an embodiment of the inventive concept. FIGS. 2A to 2D illustrate a cross-section defined by the second direction axis DR2 and the third direction axis DR3. FIGS. 2A to 2D illustrate the cross-section to show a laminate structure of functional members included in the display device DD according to an embodiment.

The display device DD according to an embodiment of the inventive concept may include a display panel, an input sensor, an anti-reflector, and a window. At least some elements of the display panel, the input sensor, the anti-reflector, and the window may be formed through a continuous process or may be coupled to each other using an adhesive member. FIGS. 2A to 2D exemplarily illustrate an optically clear adhesive OCA as the adhesive member. The adhesive member may include a typical adhesive or removable adhesive. In an embodiment of the inventive concept, the anti-reflector and the window may be replaced with other elements or may be omitted.

With regard to FIGS. 2A to 2D, any one element that is formed with another element through a continuous process, among the input sensor, the anti-reflector, and the window is referred to as a "layer". Any one element that is coupled to another element through an adhesive member, among the input sensor, the anti-reflector, and the window is referred to as a "panel". The panel includes a base layer that provides a base surface, for example, a synthetic resin layer, a composite material layer, a glass substrate, or the like, but the "layer" may not be provided with the base layer. In particular, the units referred to as a "layer" are arranged on the base surface provided by another unit.

The input sensor, the anti-reflector, and the window may be referred to as an input sensing panel ISP, an anti-reflection panel RPP, and a window panel WP, or an input sensing layer ISL, an anti-reflection layer RPL, and a window layer WL.

Figure 2A:
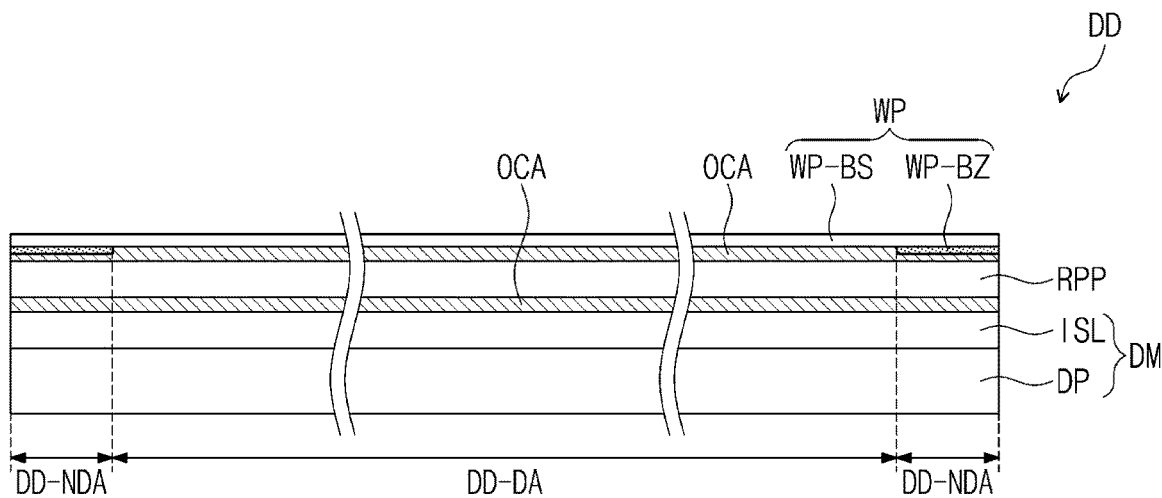
FIGS. 2A, 2B, 2C, and 2D are cross-sectional views of a display device according to an embodiment of the inventive concept.
Figure 2A:
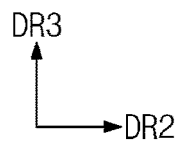

As illustrated in FIG. 2A, the display device DD may include a display panel DP, the input sensing layer ISL, the anti-reflection panel RPP, and the window panel WP. The input sensing layer ISL may be directly disposed on the display panel DP. As used herein, the term element B being "directly disposed" on element A may refer that an additional adhesive layer/adhesive member is not disposed between the element A and element B. For example, element B may be formed through a continuous process on the base surface provided by element A, after element A is formed.

The display panel DP and the input sensing layer ISL directly disposed thereon may be defined as a display module DM. Optically clear adhesives OCA are disposed between the display module DM and the anti-reflection panel RPP and between the anti-reflection panel RPP and the window panel WP.

The display panel DP generates an image, and the input sensing layer ISL obtains coordinate information of an external input (e.g., a touch event). The display module DM according to an embodiment of the inventive concept may further include a protective member disposed under the display panel DP. The protective member and the display panel DP may be bonded by an adhesive member. The display devices DD described below and illustrated in FIGS. 2B to 2D may also include a protective member.

The display panel DP according to an embodiment of the inventive concept may be an light-emitting display panel, but the inventive concepts are not limited thereto. For example, the display panel DP may be an organic light-emitting display panel or a quantum dot light-emitting display panel. An emission layer of the organic light-emitting display panel may include an organic light-emitting material. An emission layer of the quantum dot light-emitting display panel may include quantum dots, quantum rods, etc. Hereinafter, the display panel DP will be described as an organic light-emitting display panel.

The anti-reflection panel RPP reduces a reflection ratio of external light incident above the window panel WP. The anti-reflection panel RPP according to an embodiment of the inventive concept may include a phase retarder and a polarizer. The phase retarder may be a film type or a liquid coating type, and may include a $\lambda/2$ phase retarder and/or a $\lambda/4$ phase retarder. The polarizer may be a film type or a liquid crystal coated type. The film type may include a stretched synthetic resin film, and the liquid crystal coated type may include liquid crystals arranged in a predetermined form. The phase retarder and the polarizer may further include a protective layer. The phase retarder and the polarizer, or those including the protective layer thereof may function as the base layer of the anti-reflection panel RPP.

The anti-reflection panel RPP according to an embodiment of the inventive concept may include color filters. The color filters may have a predetermined arrangement. The arrangement of the color filters may be determined in consideration of colors of light emitted from pixels included in the display panel DP. The anti-reflection panel RPP may further include a black matrix adjacent to the color filters.

The anti-reflection panel RPP according to an embodiment of the inventive concept may include a destructive interference structure. For example, the destructive interference structure may include a first reflective layer and a second reflective layer arranged on different layers. First reflected light and second reflected light reflected from the first reflective layer and the second reflective layer may destructively interfere with each other, thereby reducing the reflection ratio of external light.

The window panel WP according to an embodiment of the inventive concept includes a base layer WP-BS and a light shielding pattern WP-BZ. The base layer WP-BS may include a glass substrate and/or a synthetic resin layer. The base layer WP-BS is not limited to a single layer. For example, the base layer WP-BS may include two or more layers bonded by an adhesive member.

The light shielding pattern WP-BZ partially overlaps the base layer WP-BS. The light shielding pattern WP-BZ may be disposed on a rear surface of the base layer WP-BS, and may substantially define the bezel region DD-NDA of the display device DD. A region not disposed with the light shielding pattern WP-BZ may define the image region DD-DA of the display device DD. In the window panel WP, a region disposed with the light shielding pattern WP-BZ may be defined as a light shielding region of the window panel WP, and a region not disposed with the light shielding pattern WP-BZ may be defined as a transmissive region of the window panel WP.

Figure 2B:
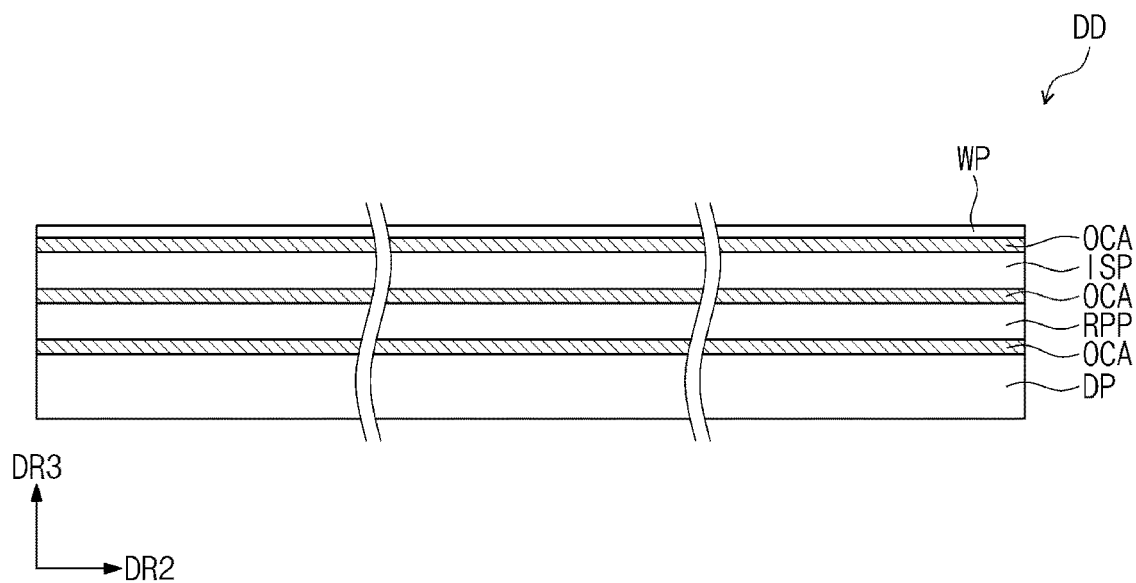
Figure 2B:
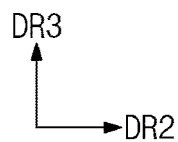
Figure 2C:
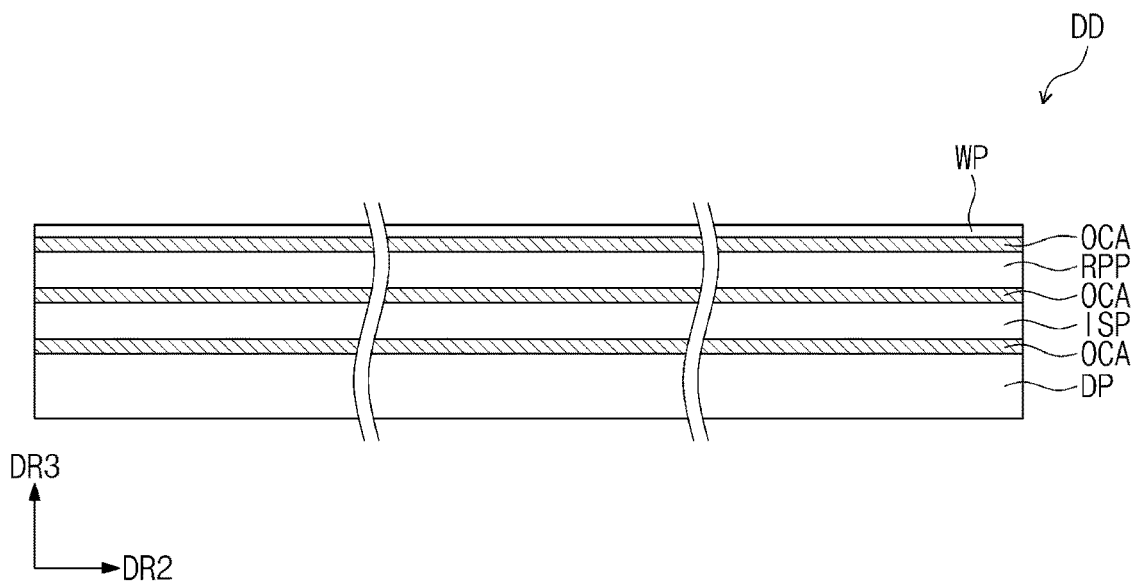
Figure 2D:
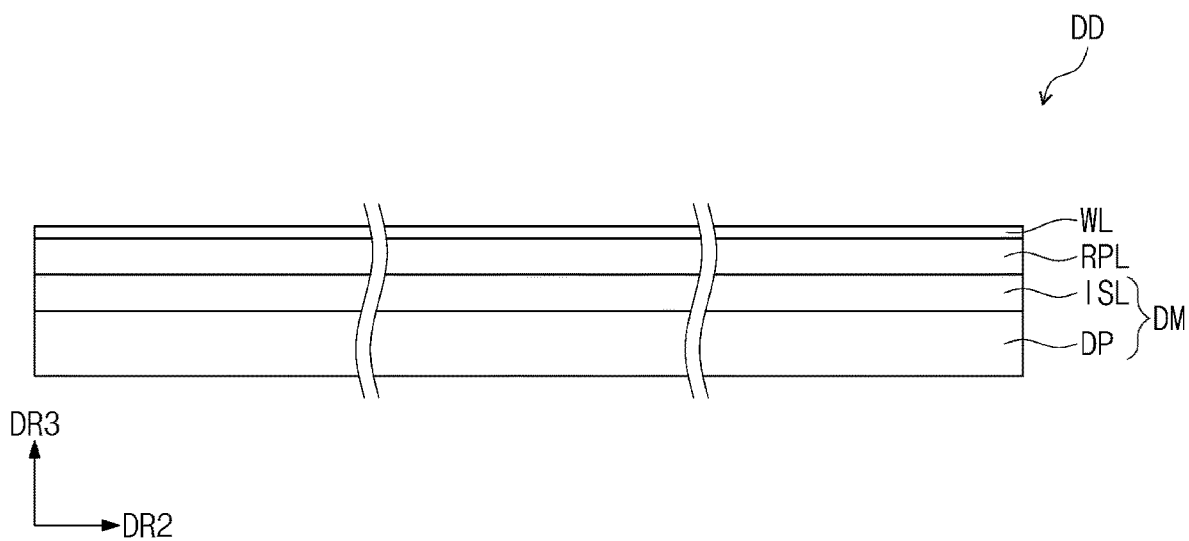

The light shielding pattern WP-BZ may have a multilayer structure. The multilayer structure may include a colored layer and a black light shielding layer. The colored layer and the black light shielding layer may be formed through a deposition, printing, or coating process. The window panel WP may further include a functional coating layer disposed on a front surface of the base layer WP-BS. The functional coating layer may include an anti-fingerprint layer, an anti-reflection layer, a hard coating layer, etc. In FIGS. 2B to 2D, the window panel WP and the window layer WL are simply illustrated without differentiating the base layer WP-BS and the light shielding pattern WP-BZ.

As illustrated in FIGS. 2B and 2C, the display device DD may include the display panel DP, the input sensing panel ISP, the anti-reflection panel RPP, and the window panel WP. In some embodiments, a stacked sequence of the input sensing panel ISP and the anti-reflection panel RPP may be changed.

As illustrated in FIG. 2D, the display device DD may include the display panel DP, the input sensing layer ISL, the anti-reflection layer RPL, and the window layer WL. Compared to the display device DD of FIG. 2A, the display device DD according to the illustrated embodiment is not provided with adhesive members, and the input sensing layer ISL, the anti-reflection layer RPL, and the window layer WL may be formed through a continuous process on a base surface provided to the display panel DP. In some embodiments, a stacked sequence of the input sensing layer ISL and the anti-reflection layer RPL may be changed.

Figure 3A:
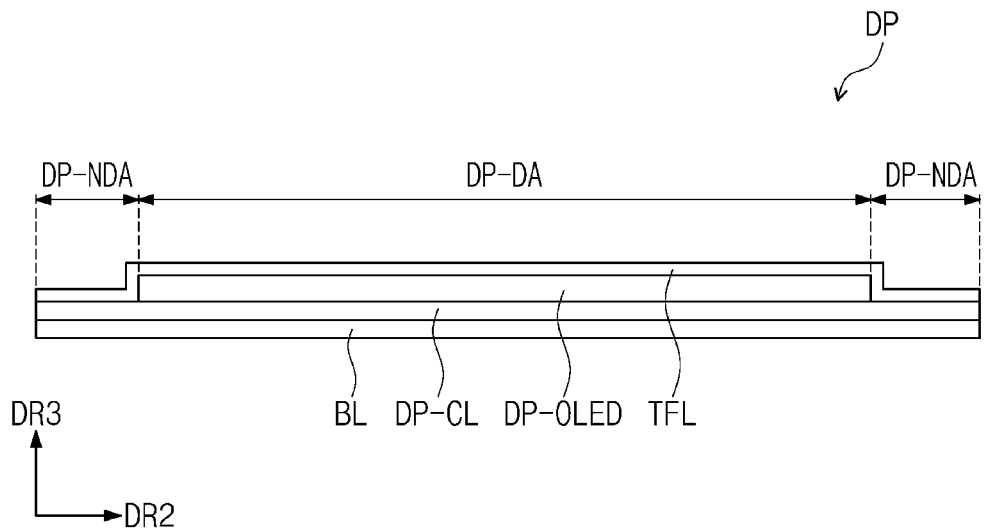
FIGS. 3A and 3B are cross-sectional views of a display panel according to embodiments of the inventive concept.
Figure 3B:
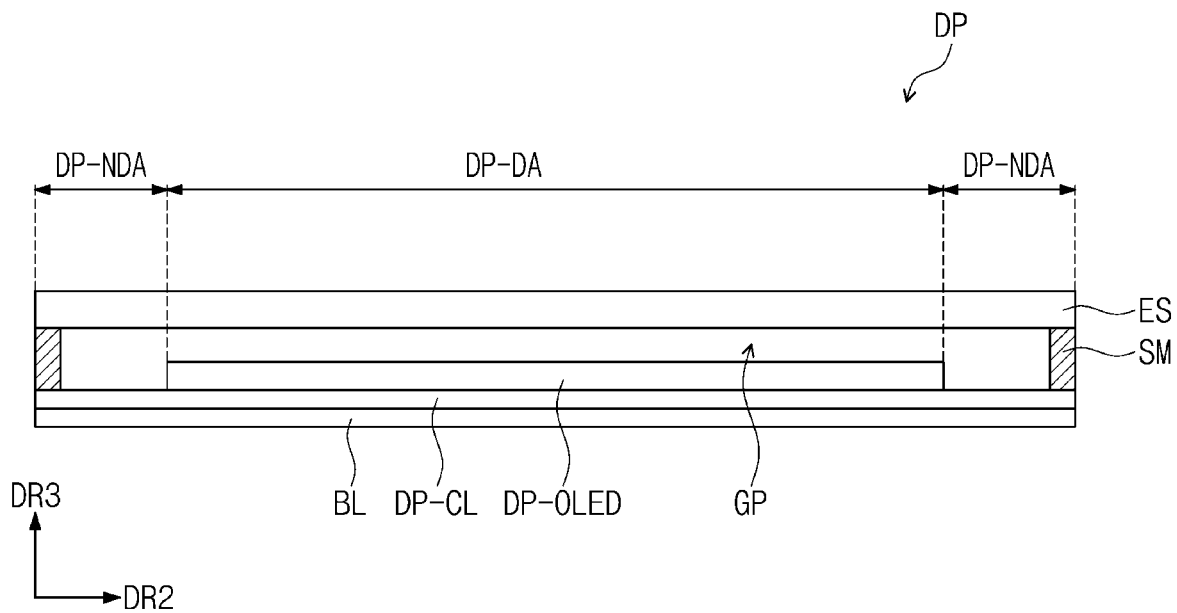

FIGS. 3A and 3B are cross-sectional views of a display panel DP according to embodiments of the inventive concept.

As illustrated in FIG. 3A, the display panel DP according to an embodiment includes a base layer BL, and a circuit element layer DP-CL, a display element layer DP-OLED, and an upper insulating layer TFL disposed on the base layer BL. A display region DP-DA and a non-display region DP-NDA corresponding to the image region DD-DA and the bezel region DD-NDA illustrated in FIG. 1 may be defined in the display panel DP. As used herein, when a region is referred to as corresponding to another region, the regions overlap each other but do not necessarily have the same area/shape.

The base layer BL may include at least one plastic film. The base layer BL may include a plastic substrate, a glass substrate, a metal substrate, an organic/inorganic composite material substrate, etc.

The circuit element layer DP-CL includes at least one insulating layer and a circuit element. The insulating layer may include at least one inorganic layer and at least one organic layer. The circuit element includes signal lines, a pixel driving circuit, etc., which will be described in more detail below.

The display element layer DP-OLED may include at least one or more organic light-emitting diodes. The display element layer DP-OLED may further include an organic layer, such as a pixel defining layer.

The upper insulating layer TFL includes a plurality of thin layers. A part of the thin layers is disposed to improve optical efficiency, and another part of the thin layers is disposed to protect the organic light-emitting diodes. The upper insulating layer TFL will be described in more detail below.

As illustrated in FIG. 3B, the display panel DP according to an embodiment includes the base layer BL, the circuit element layer DP-CL, display element layer DP-OLED, and encapsulation substrate ES arranged on the base layer BL, and a sealant SM for bonding the base layer BL and the encapsulation substrate ES. The encapsulation substrate ES may be spaced apart from the display element layer DP-OLED with a predetermined gap GP therebetween. The base layer BL and the encapsulation substrate ES may include a plastic substrate, a glass substrate, a metal substrate, an organic/inorganic composite material substrate, etc. The sealant SM may include an organic adhesive member, frit, or the like. The sealant SM may be in contact with the circuit element layer DP-CL, however, the inventive concepts are not limited thereto. For example, a part of the circuit element layer DP-CL may be removed, and the sealant SM may contact the base layer BL.

Figure 4:
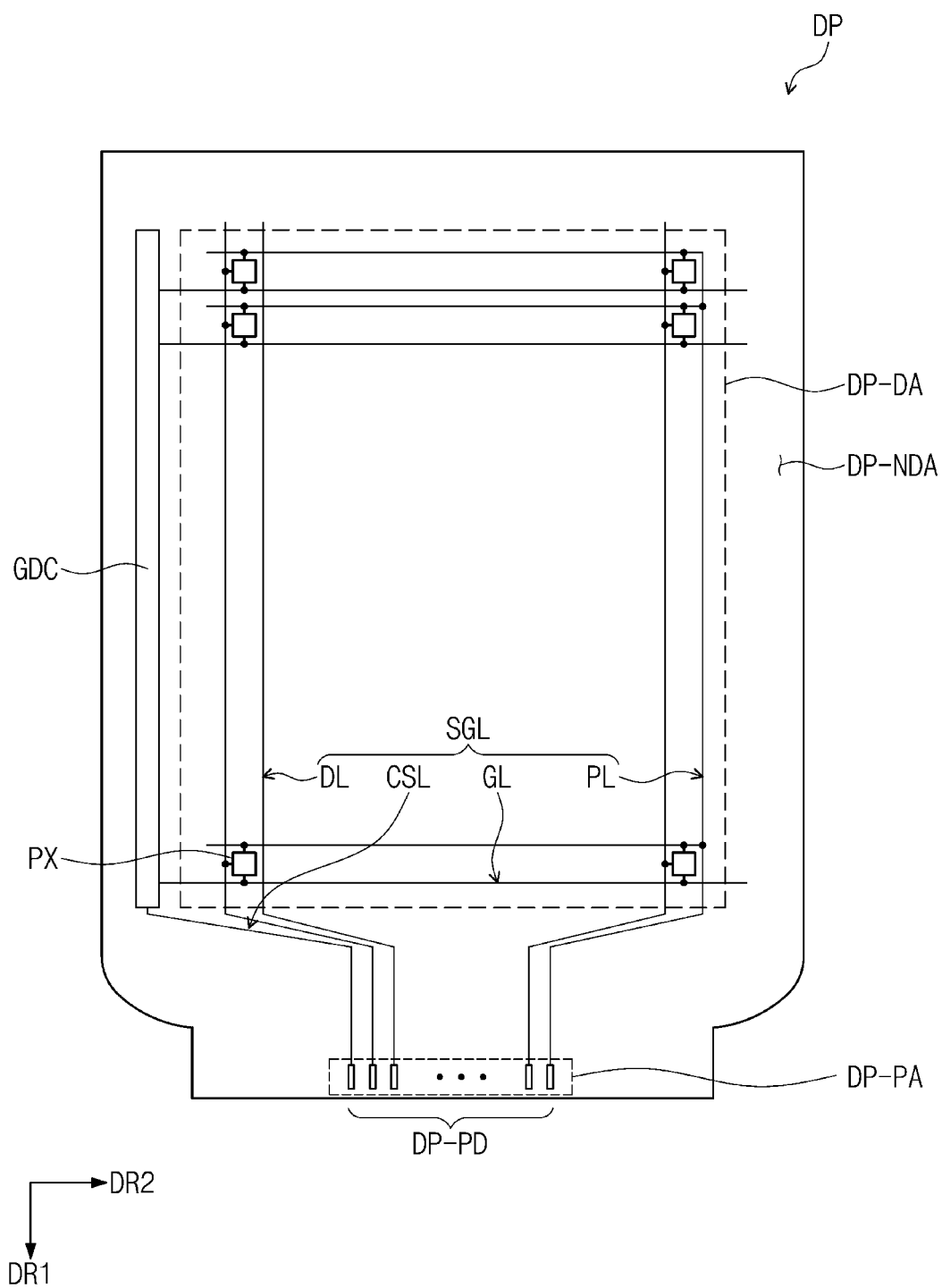
FIG. 4 is a planar view of a display panel according to an embodiment of the inventive concept.
Figure 5A:
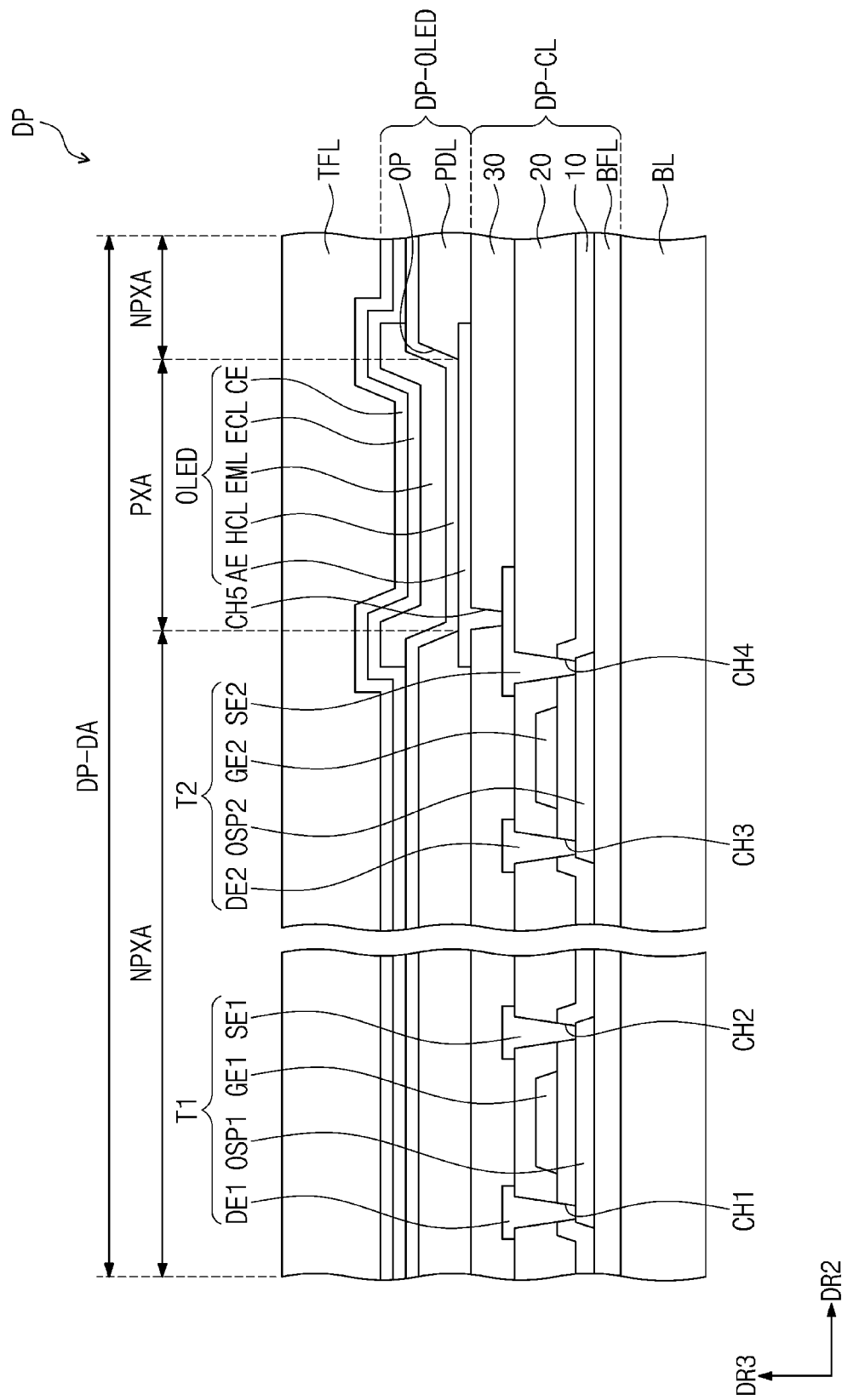
FIG. 5A is an enlarged cross-sectional view of a display panel of FIG. 3A according to an embodiment of the inventive concept.
Figure 5B:
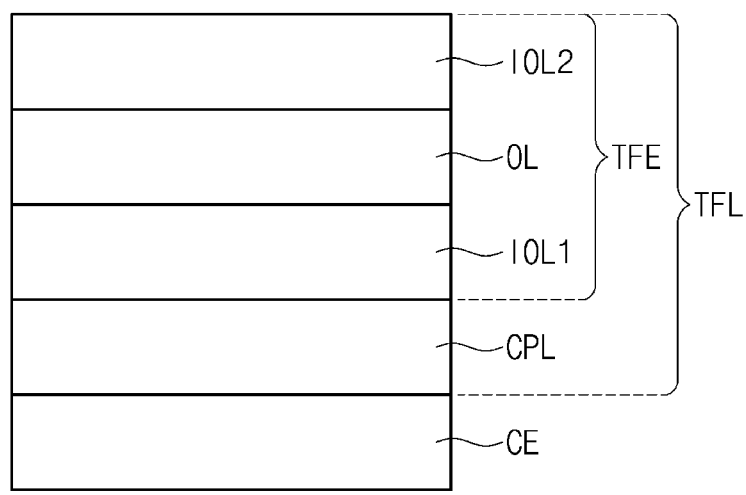
FIG. 5B is an enlarged cross-sectional view of an upper insulating layer according to an embodiment of the inventive concept.

FIG. 4 is a planar view of a display panel DP according to an embodiment of the inventive concept. FIG. 5A is an enlarged cross-sectional view of the display panel DP of FIG. 3A. FIG. 5B is an enlarged cross-sectional view of the upper insulating layer TFL according to an embodiment of the inventive concept.

As illustrated in FIG. 4, the display panel DP may include a driving circuit GDC, a plurality of signal lines SGL (hereinafter referred to as "signal lines"), a plurality of signal pads DP-PD (hereinafter referred to as "signal pads"), and a plurality of pixels PX (hereinafter referred to as "pixels").

The display region DP-DA may be defined as a region in which the pixels PX are arranged. Each of the pixels PX may include an organic light-emitting diode and a pixel driving circuit connected thereto. The driving circuit GDC, the signal lines SGL, the signal pads DP-PD, and the pixel driving circuit may be included in the circuit element layer DP-CL illustrated in FIGS. 3A and 3B.

The driving circuit GDC may include a scan driving circuit. The scan driving circuit generates a plurality of scan signals (hereinafter referred to as "scan signals"), and sequentially outputs the scan signals to a plurality of scan lines GL (hereinafter referred to as "scan lines") that will be described in more detail later. The scan driving circuit may further output another control signal to the driving circuit of the pixels PX.

The scan driving circuit may include a plurality of thin-film transistors, which may be formed through substantially the same process for forming the driving circuit of the pixels PX, for example, a low temperature polycrystalline silicon (LTPS) process or a low temperature polycrystalline oxide (LTPO) process.

The signal lines SGL include scan lines GL, data lines DL, power supply line PL, and control signal line CSL. The scan lines GL are respectively connected to corresponding pixels PX, and the data lines DL are respectively connected to corresponding pixels PX. The power supply line PL is connected to the pixels PX. The control signal lines CSL may provide control signals to the scan driving circuit.

The signal lines SGL overlap the display region DP-DA and the non-display region DP-NDA. The signal lines SGL may include a pad unit and a line unit. The line unit overlaps the display region DP-DA and the non-display region DP-NDA. The pad unit is disposed at an end of the line unit. The pad unit is disposed in the non-display region DP-NDA, and overlaps a corresponding signal pad among the signal pads DP-PD. A part of the non-display region DP-NDA, in which the signal pads DP-PD are arranged, may be defined as a pad region DP-PA. A circuit substrate may be connected to the pad region DP-PA.

The line unit substantially connected to the pixel PX may form a greater part of the signal lines SGL. The line unit is connected to transistors T1 and T2 (see FIG. 5A) of the pixel PX. The line unit may have a single-layer or multi-layer structure, and may have a single body or at least two parts. The at least two parts may be arranged on different layers, and may be connected to each other via a contact hole penetrating an insulating layer disposed between the at least two parts.

FIG. 5A is a partial cross-section of the display panel DP corresponding to the transistors T1 and T2 and the light-emitting diode OLED. The circuit element layer DP-CL disposed on the base layer BL includes at least one insulating layer and a circuit element. The circuit element includes a signal line, a pixel driving circuit, etc. The circuit element layer DP-CL may be formed through a process of forming an insulating layer, a semiconductor layer, and a conductive layer by coating, deposition, or the like, and a process of patterning the insulating layer, the semiconductor layer, and the conductive layer by photolithography.

The circuit element layer DP-CL according to an embodiment may include a buffer layer BFL, a first inorganic layer 10, and a second inorganic layer 20, and an organic layer 30. The buffer layer BFL may include a plurality of laminated inorganic layers. FIG. 5A exemplarily illustrates an arrangement of a first semiconductor pattern OSP1, a second semiconductor pattern OSP2, a first control electrode GE1, a second control electrode GE2, a first input electrode DE1, a first output electrode SE1, a second input electrode DE2, and a second output electrode SE2, which form a switching transistor T1 and a driving transistor T2. First to fourth through-holes CH1 to CH4 are also exemplarily illustrated.

The display element layer DP-OLED may include an organic light-emitting diode OLED. The display element layer DP-OLED includes a pixel defining layer PDL. For example, the pixel defining layer PDL may be an organic layer.

A first electrode AE is disposed on the organic layer 30. The first electrode AE is connected to the second output electrode SE2 via a fifth through-hole CH5 penetrating the organic layer 30. An opening OP is defined in the pixel defining layer PDL. The opening OP of the pixel defining layer PDL exposes at least a part of the first electrode AE. The opening OP of the pixel defining layer PDL is referred to as a "light emission opening" in order to differentiate the opening OP from other openings.

As illustrated in FIG. 5A, the display region DP-DA may include a light emission region PXA and a non-light-emission region NPXA adjacent thereto. The non-light-emission region NPXA may surround the light emission region PXA. In the illustrated embodiment of the inventive concept, the light emission region PXA is defined to correspond to a partial region of the first electrode AE exposed by the light emission opening OP.

A hole control layer HCL may be disposed commonly in the light emission region PXA and the non-light-emission region NPXA. The hole control layer HCL may include a hole transport layer, and may further include a hole injection layer. An emission layer EML is disposed on the hole control layer HCL. The emission layer EML may be disposed in a region corresponding to the light emission opening OP. More particularly, the emission layer EML may be separately formed in each pixel. The emission layer EML may include an organic material and/or an inorganic material. The emission layer EML may generate predetermined color light.

An electron control layer ECL is disposed on the emission layer EML. The electron control layer ECL may include an electron transport layer, and may further include an electron injection layer. The hole control layer HCL and the electron control layer ECL may be formed commonly in a plurality of pixels using an open mask. A second electrode CE is disposed on the electron control layer ECL. The second electrode CE has a single body and is disposed commonly in a plurality of pixels.

As illustrated in FIGS. 5A and 5B, the upper insulating layer TFL is disposed on the second electrode CE. The upper insulating layer TFL may include a plurality of thin layers. The upper insulating layer TFL according to an embodiment may include a capping layer CPL and a thin-film encapsulation layer TFE. The thin-film encapsulation layer TFE may include a first inorganic layer IOL1, an organic layer OL, and a second inorganic layer IOL2.

The capping layer CPL is disposed on the second electrode CE and contacts the second electrode CE. The capping layer CPL may include an organic material. The first inorganic layer IOL1 is disposed on the capping layer CPL and contacts the capping layer CPL. The organic layer OL is disposed on the first inorganic layer IOL1 and contacts the first inorganic layer IOL1. The second inorganic layer IOL2 is disposed on the organic layer OL and contacts the organic layer OL.

The capping layer CPL protects the second electrode CE from a subsequent process, for example, a sputtering process, and improves light emission efficiency of the organic light-emitting diode OLED. The capping layer CPL may have a greater refractive index than that of the first inorganic layer IOL1.

The first inorganic layer IOL1 and the second inorganic layer IOL2 protects the display element layer DP-OLED from moisture/oxygen, and the organic layer OL protects the display element layer DP-OLED from foreign matter, such as dust particles. The first inorganic layer IOL1 and the second inorganic layer IOL2 may be any one of a silicon nitride layer, a silicon oxynitride layer, and a silicon oxide layer. In an embodiment of the inventive concept, the first inorganic layer IOL1 and the second inorganic layer IOL2 may further include a titanium oxide layer, an aluminum oxide layer, or the like. The organic layer OL may include an acrylic organic layer, but is not limited thereto.

In an embodiment, an inorganic layer, for example, a LiF layer, may be further disposed between the capping layer CPL and the first inorganic layer IOL1. The LiF layer may improve the light emission efficiency of the light-emitting element OLED.

Figure 6A:
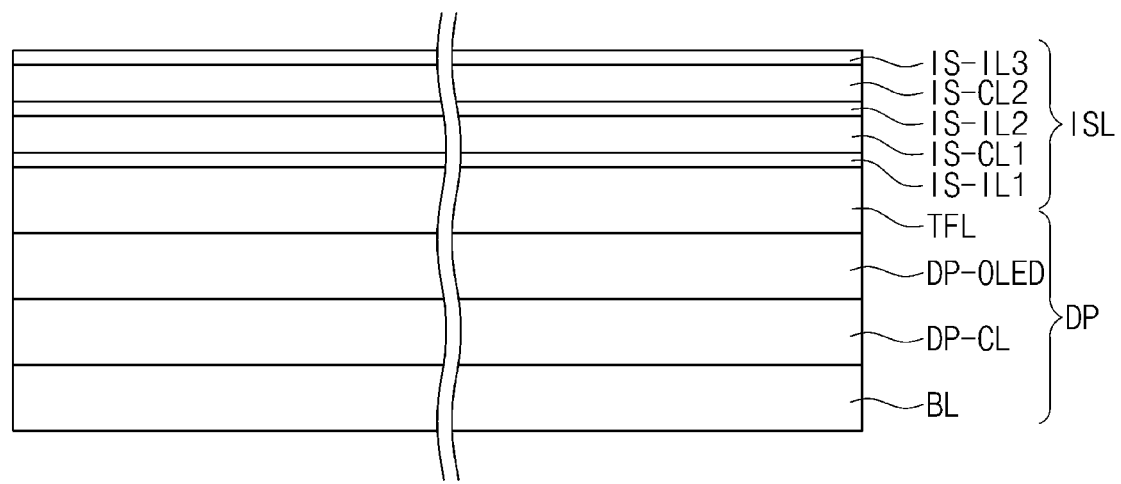
FIG. 6A is a cross-sectional view of an input sensing layer according to an embodiment of the inventive concept.
Figure 6A:
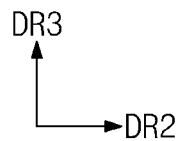
Figure 6B:
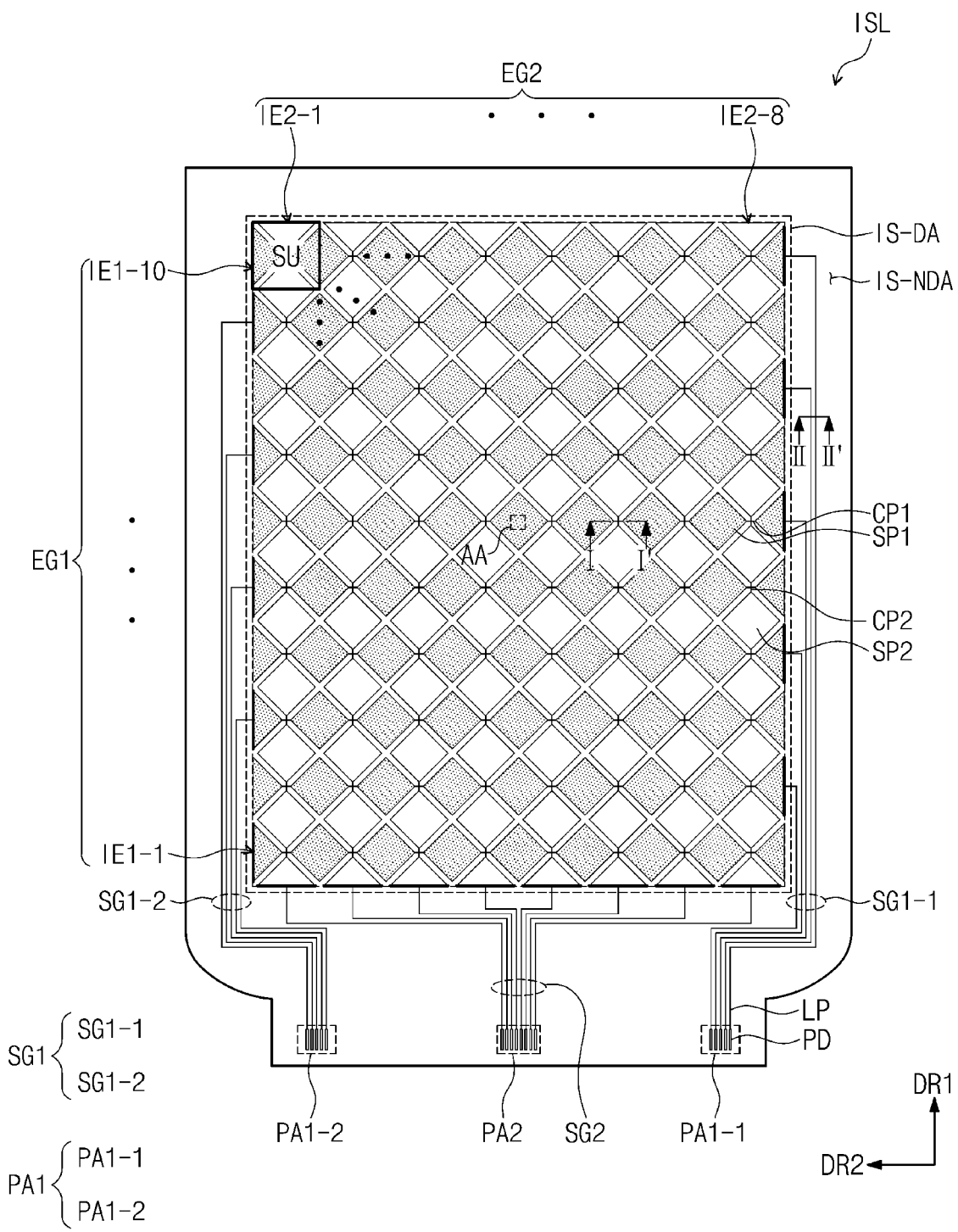
FIG. 6B is a planar view of an input sensing layer according to an embodiment of the inventive concept.
Figure 6C:
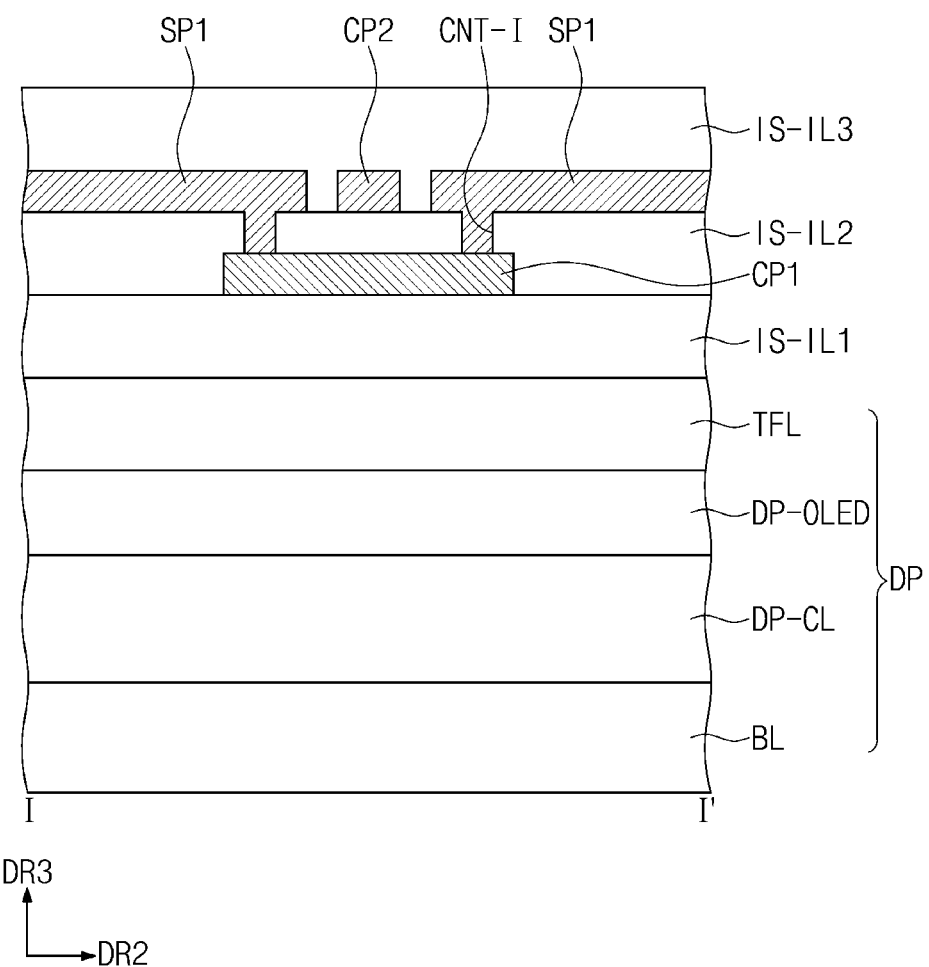
FIGS. 6C and 6D are partial cross-sectional views of an input sensing layer according to an embodiment of the inventive concept.
Figure 6D:
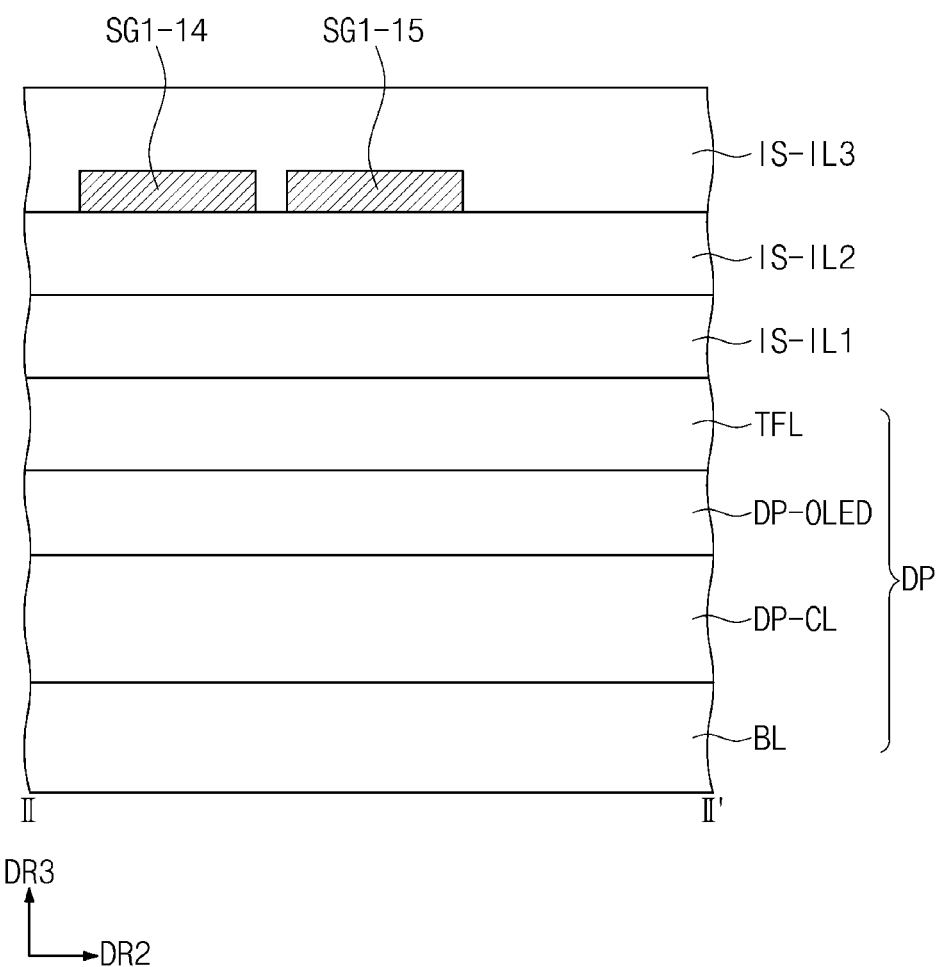
Figure 6E:
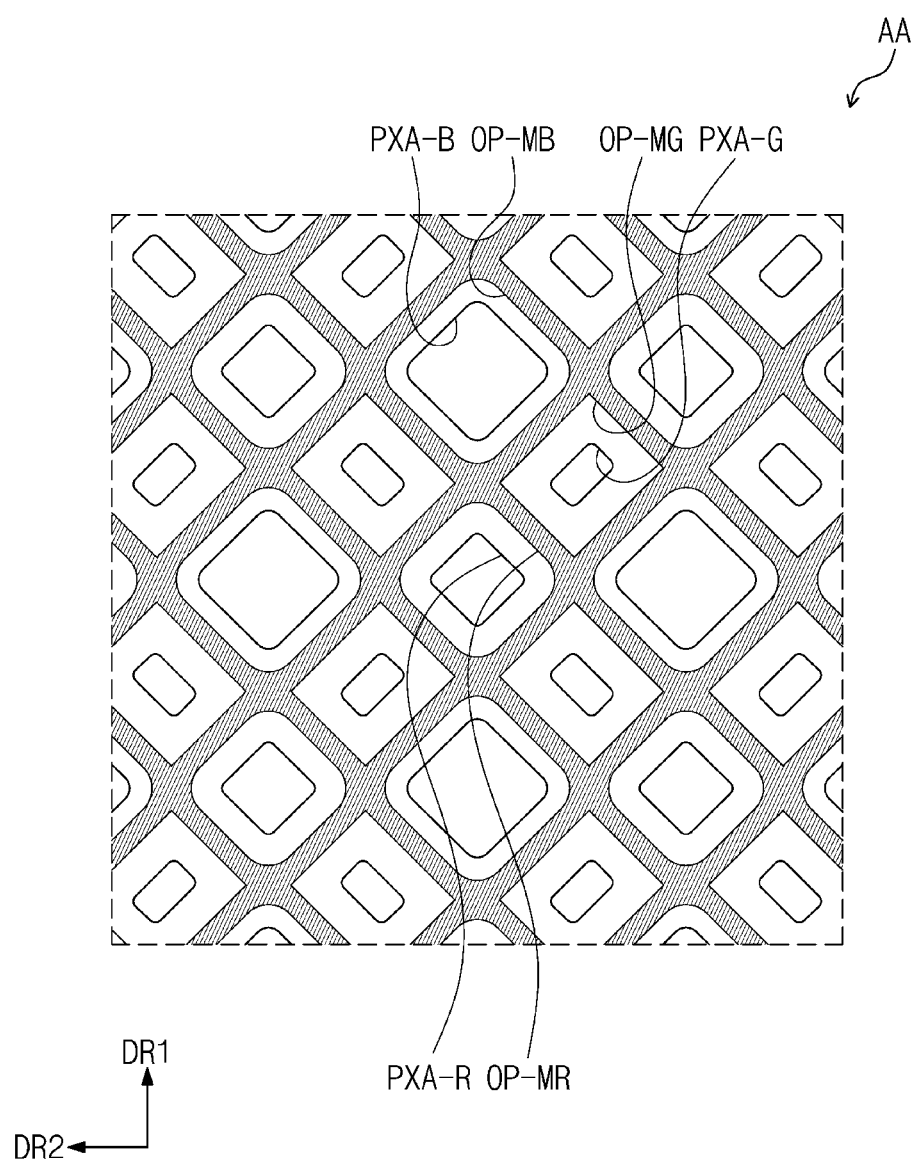
FIG. 6E is an enlarged planar view of region AA of FIG. 6B.

FIG. 6A is a cross-sectional view of the input sensing layer ISL according to an embodiment of the inventive concept. FIG. 6B is a planar view of the input sensing layer ISL according to an embodiment of the inventive concept. FIGS. 6C and 6D are partial cross-sectional views of the input sensing layer ISL according to an embodiment of the inventive concept. FIG. 6E is an enlarged planar view of region AA of FIG. 6B. FIGS. 6A to 6E exemplarily illustrate the input sensing layer ISL as an input sensor.

As illustrated in FIG. 6A, the input sensing layer ISL may include a first insulating layer IS-IL1, a first conductive layer IS-CL1, a second insulating layer IS-IL2, a second conductive layer IS-CL2, and a third insulating layer IS-IL3. The first insulating layer IS-IL1 may be directly disposed on the upper insulating layer TFL. In an embodiment of the inventive concept, the first insulating layer IS-IL1 may be omitted.

Each of the first conductive layer IS-CL1 and the second conductive layer IS-CL2 may have a single-layer structure, or may have a multi-layer structure laminated along the third direction axis DR3. The multi-layer conductive layer may include at least two among transparent conductive layers and metal layers. The multi-layer conductive layer may include metal layers including different metals. The transparent conductive layer may include indium tin oxide (ITO), indium zinc oxide (IZO), zinc oxide (ZnO), indium tin zinc oxide (ITZO), PEDOT, metal nanowire, and graphene. The metal layer may include molybdenum, silver, titanium, aluminum, and an alloy thereof. For example, each of the first conductive layer IS-CL1 and the second conductive layer IS-CL2 may have a metallic triple-layer structure, for example, a triple-layer structure of titanium/aluminum/titanium.

Each of the first conductive layer IS-CL1 and the second conductive layer IS-CL2 includes a plurality of conductive patterns. Hereinafter, the first conductive layer IS-CL1 is described as including first conductive patterns, and the second conductive layer IS-CL2 is described as including second conducive patterns. Each of the first conductive patterns and the second conductive patterns may include sensing electrodes and signal lines connected thereto.

Each of the first to third insulating layers IS-IL1 to IS-IL3 may include an inorganic material or an organic material. In an embodiment of the inventive concept, the first insulating layer IS-IL1 and the second insulating layer IS-IL2 may be inorganic layers including inorganic materials. The inorganic layers may include at least one of aluminum oxide, titanium oxide, silicon oxide, silicon oxynitride, zirconium oxide, or hafnium oxide. The third insulating layer IS-IL3 may include an organic layer. The organic layer may include at least one of acrylic resin, methacrylic resin, polyisoprene, vinyl-based resin, epoxy-based resin, urethane-based resin, cellulosic resin, siloxane-based resin, polyimide-based resin, polyamide-based resin, or perylene-based resin.

In an embodiment of the inventive concept, the second insulating layer IS-IL2 may cover a sensing region IS-DA that will be described later. In particular, the second insulating layer IS-IL2 may substantially overlap the sensing region IS-DA. The second insulating layer IS-IL2 may include a plurality of insulating patterns in some embodiments. The plurality of insulating patterns may be arranged at each intersection region of sensing units SU to insulate first sensing electrodes IE1 to IE1-10 from second sensing electrodes IE2-1 to IE2-8.

As illustrated in FIG. 6B, the input sensing layer ISL may include a sensing region IS-DA and a wiring region IS-NDA corresponding to the display region DP-DA and non-display region DP-NDA of the display panel DP, respectively. The sensing region IS-DA may be defined as a region in which a first electrode group EG1 and a second electrode group EG2 are arranged.

The input sensing layer ISL includes the first electrode group EG1, the second electrode group EG2, and signal line groups connected to the first and second electrode groups EG1 and EG2. FIG. 6B shows the input sensing layer ISL including two signal line groups SG1 and SG2 according to an embodiment. The first signal line group SG1 and the second signal line group SG2 are arranged in the wiring region IS-NDA.

In an embodiment of the inventive concept, the input sensing layer ISL may be a capacitive touch sensor. Either of the first electrode group EG1 or the second electrode group EG2 may receive a driving signal, and the other one may output a variation in capacitance between the first electrode group EG1 and the second electrode group EG2 as a sensing signal.

The first electrode group EG1 includes a plurality of first sensing electrodes IE1-1 to IE1-10. FIG. 6B shows that the first electrode group EG1 includes 10 first sensing electrodes IE1-1 to IE1-10, for example. The first sensing electrodes IE1-1 to IE1-10 have a shape extending substantially in the second direction DR2. The first sensing electrodes IE1-1 to IE1-10 are arranged in a direction away from pad regions PA1, PA2, and PA3 in the first direction DR1.

The second electrode group EG2 includes a plurality of second sensing electrodes IE2-1 to IE2-8. FIG. 6B shows that the second electrode group EG2 includes 8 second sensing electrodes IE2-1 to IE2-8, for example. The second sensing electrodes IE2-1 to IE2-8 have a shape extending substantially in the first direction DR1. The second sensing electrodes IE2-1 to IE2-8 may have a greater length than the first sensing electrodes IE1-1 to IE1-10.

The first signal line group SG1 may include the same number of first signal lines as the number of the first sensing electrodes IE1-1 to IE1-10. The first signal lines may be connected to only one of both ends of the first sensing electrodes IE1-1 to IE1-10. The other end may be electrically isolated without being connected to another conductive structure. Therefore, when the input sensing layer ISL operates, a path of current flowing from one end of the first sensing electrodes IE1-1 to IE1-10 to the other end may not be formed. This connection relationship between the signal lines and the sensing electrodes is hereinafter referred to as a "single routing structure".

The second signal line group SG2 may include the same number of second signal lines as the number of the second sensing electrodes IE2-1 to IE2-8. The second signal lines may be connected to only one of both ends of the second sensing electrodes IE2-1 to IE2-8. The second signal line group SG2 and the second sensing electrodes IE2-1 to IE2-8 may have the single routing structure. FIG. 6B shows eight signal lines of the second signal line group SG2 respectively connected to one lower ends of the second sensing electrodes IE2-1 to IE2-8.

In an embodiment of the inventive concept, the first signal lines may be divided into two groups. One of the groups may be defined as one-side signal line group SG1-1, and the other group may be defined as other-side signal line group SG1-2. The one-side signal line group SG1-1 is connected to a part of the first sensing electrodes IE1-1 to IE1-10, and the other-side signal line group SG1-2 is connected to the other part of the first sensing electrodes IE1-1 to IE1-10. The one-side signal line group SG1-1 is spaced apart from the other-side signal line group SG1-2 with the sensing region IS-DA therebetween in the second direction DR2. Since the first signal lines are separately arranged on two sides, a width of the wiring region IS-NDA may be reduced.

For example, the one-side signal line group SG1-1 may be electrically connected to odd-numbered sensing electrodes or even-numbered sensing electrodes among the first sensing electrodes IE1-1 to IE1-10. The other-side signal line group SG1-2 may be connected to sensing electrodes to which the one-side signal line group SG1-1 is not connected. In the illustrated embodiment of the inventive concept, five signal lines of the one-side signal line group SG1-1 are illustrated as being respectively connected to one right ends of the even-numbered first sensing electrodes.

The signal lines of the first signal line group SG1 (hereinafter referred to as "first signal lines") and the signal lines of the second signal line group SG2 (hereinafter referred to as "second signal lines") may include a pad unit PD and a line unit LP. The pad unit PD, which is disposed in the pad regions PA1 and PA2, is a part connected to a circuit board. The circuit board connected to the pad regions PA1 and PA2 may be mounted with a sensing circuit or may be connected to a circuit board mounted with a sensing circuit.

The first sensing electrodes IE1-1 to IE1-10 and the second sensing electrodes IE2-1 to IE2-8 may intersect each other while being insulated from each other. Bridge patterns (hereinafter referred to as "first bridge patterns") are arranged in intersection regions. In an embodiment of the inventive concept, the first bridge patterns may form a part of the first sensing electrodes IE1-1 to IE1-10 having a relatively short length. Since the first bridge patterns are formed in the first sensing electrodes IE1-1 to IE1-10, an equivalent resistance of the input sensing layer ISL may be reduced, thereby improving sensing sensitivity. Relevant detailed descriptions will be provided later.

Each of the first sensing electrodes IE1-1 to IE1-10 may include a plurality of first sensor parts SP1 and a plurality of first connection parts CP1. The first sensor parts SP1 are arranged along substantially the second direction DR2. Each of the first connection parts CP1 connects two neighboring first sensor parts among the first sensor parts SP1.

Each of the second sensing electrodes IE2-1 to IE2-8 includes a plurality of second sensor parts SP2 and a plurality of second connection parts CP2. The second sensor parts SP2 are arranged along the substantially first direction DR1. Each of the second connection parts CP2 connects two neighboring second sensor parts among the second sensor parts SP2.

FIG. 6B shows that the first connection part CP1 intersects with the second connection part CP2 according to an embodiment. In the illustrated embodiment of the inventive concept, the first connection part CP1 may correspond to the first bridge pattern.

As illustrated in FIG. 6C, the plurality of first connection parts CP1 may be formed from the first conductive layer IS-CL1, and the plurality of first sensor parts SP1, the plurality of second sensor parts SP2, and the plurality of second connection parts CP2 may be formed from the second conductive layer IS-CL2. The first sensor parts SP1 and the first connection part CP1 may be connected through contact holes CNT-I penetrating the second insulating layer IS-IL2.

The plurality of first connection parts CP1 and the plurality of second connection parts CP2 are illustrated as intersecting with each other according to the illustrated embodiment, however, the inventive concepts are not limited thereto. For example, each of the first connection parts CP1 may have a bent shape, such as "∧" and/or "∨" so as not to overlap the second connection parts CP2. In this case, the first connection parts CP1 having the bent shape may overlap the second sensor parts SP2 in a plan view.

Referring back to FIG. 6B, the sensing region IS-DA may be divided into a plurality of sensing units SU.

The plurality of sensing units SU may have the same area. Each of the plurality of sensing units SU includes a corresponding intersection region among intersection regions between the first sensing electrodes IE1 to IE1-10 and the second sensing electrodes IE2-1 to IE2-8. The intersection region is a region in which the first bridge pattern is arranged. FIG. 6B exemplarily illustrates the sensing region IS-DA divided into sensing units SU in an 8×10 matrix.

FIG. 6D illustrates two signal lines SG1-14 and SG1-15 of the first signal line group SG1. The signal lines of the first signal line group SG1 and second signal line group SG2 include at least a part arranged on the same layer as the second sensing electrodes IE2-1 to IE2-8. The signal lines of the first signal line group SG1 and second signal line group SG2 may be formed from the second conductive layer IS-CL2 (see FIG. 6A).

In some embodiments, the signal lines of the first signal line group SG1 and second signal line group SG2 may further include a part formed from the first conductive layer IS-CL1 (see FIG. 6A). The part formed from the second conductive layer IS-CL2 and the part formed from the first conductive layer IS-CL1 may be connected through contact holes penetrating the second insulating layer IS-IL2. This double-layer signal line may have a low resistance.

The first sensing electrodes IE1-1 to IE1-10 and the second sensing electrodes IE2-1 to IE2-8 may have a mesh shape. FIG. 6E exemplarily illustrates a first sensor part SP1 have the mesh shape.

Three types of openings OP-MG, OP-MR, and OP-MB are defined in the first sensor part SP1. The three types of openings OP-MG, OP-MR, and OP-MB may correspond to three types of light emission openings PXA-G, PXA-R, and PXA-B. The three types of light emission openings PXA-G, PXA-R, and PXA-B are defined in the same manner as the light emission opening OP of the pixel defining layer PDL illustrated in FIG. 5A.

The three types of light emission openings PXA-G, PXA-R, and PXA-B may be defined by their size of the openings, and the areas of the first-type emission opening PXA-G, second-type emission opening PXA-R, and third-type emission opening PXA-B are proportional to a light emission area of a corresponding pixel.

Figure 7A:
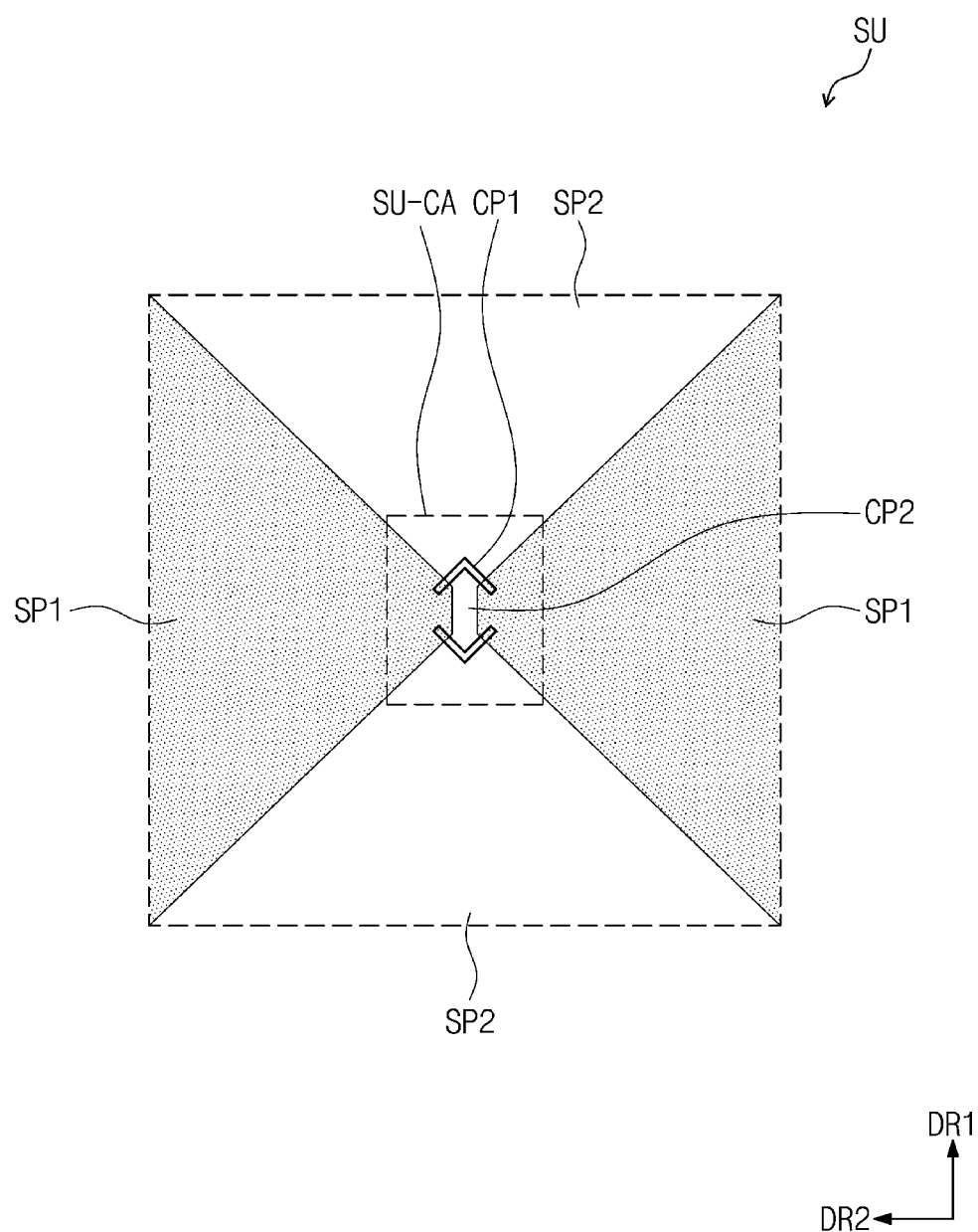
FIG. 7A is a planar view of a sensing unit according to an embodiment of the inventive concept.
Figure 7B:
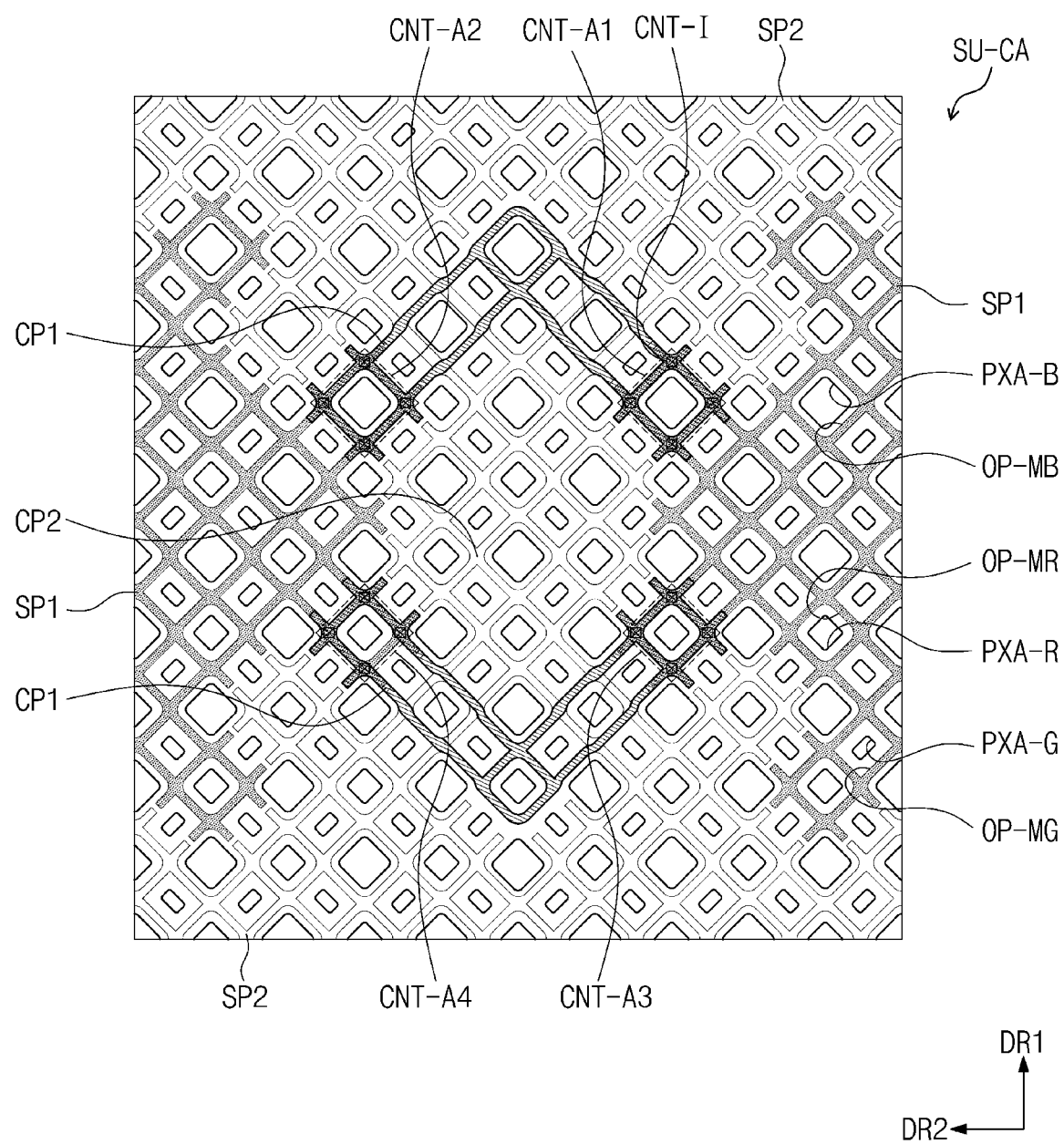
FIG. 7B is an enlarged planar view of an intersection region of a sensing unit according to an embodiment of the inventive concept.
Figure 7C:
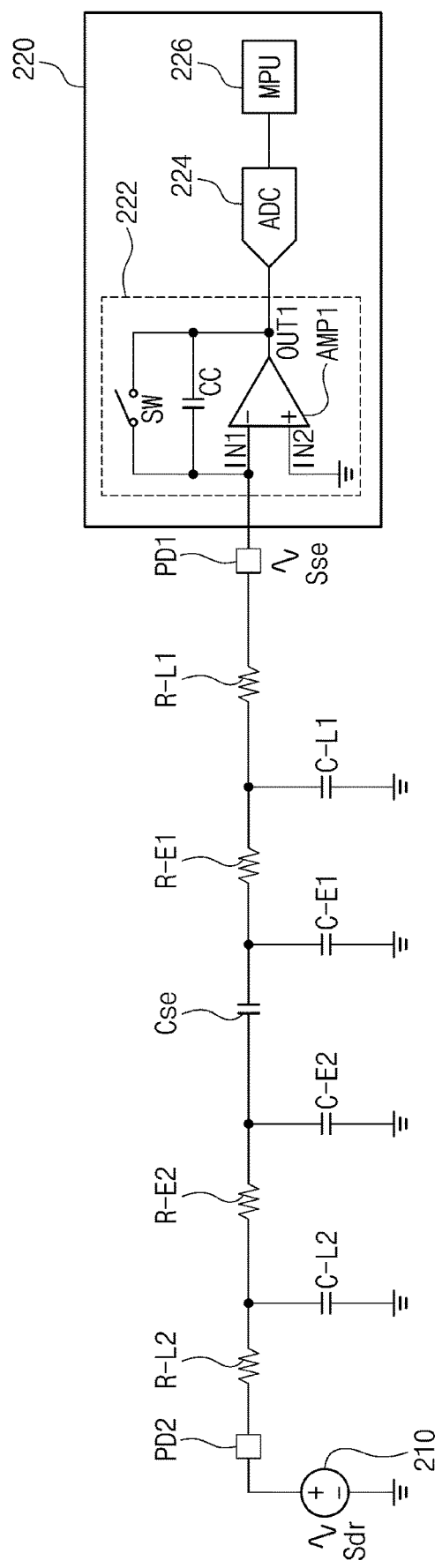
FIG. 7C is an equivalent circuit diagram of an input sensor according to an embodiment of the inventive concept.
Figure 7D:
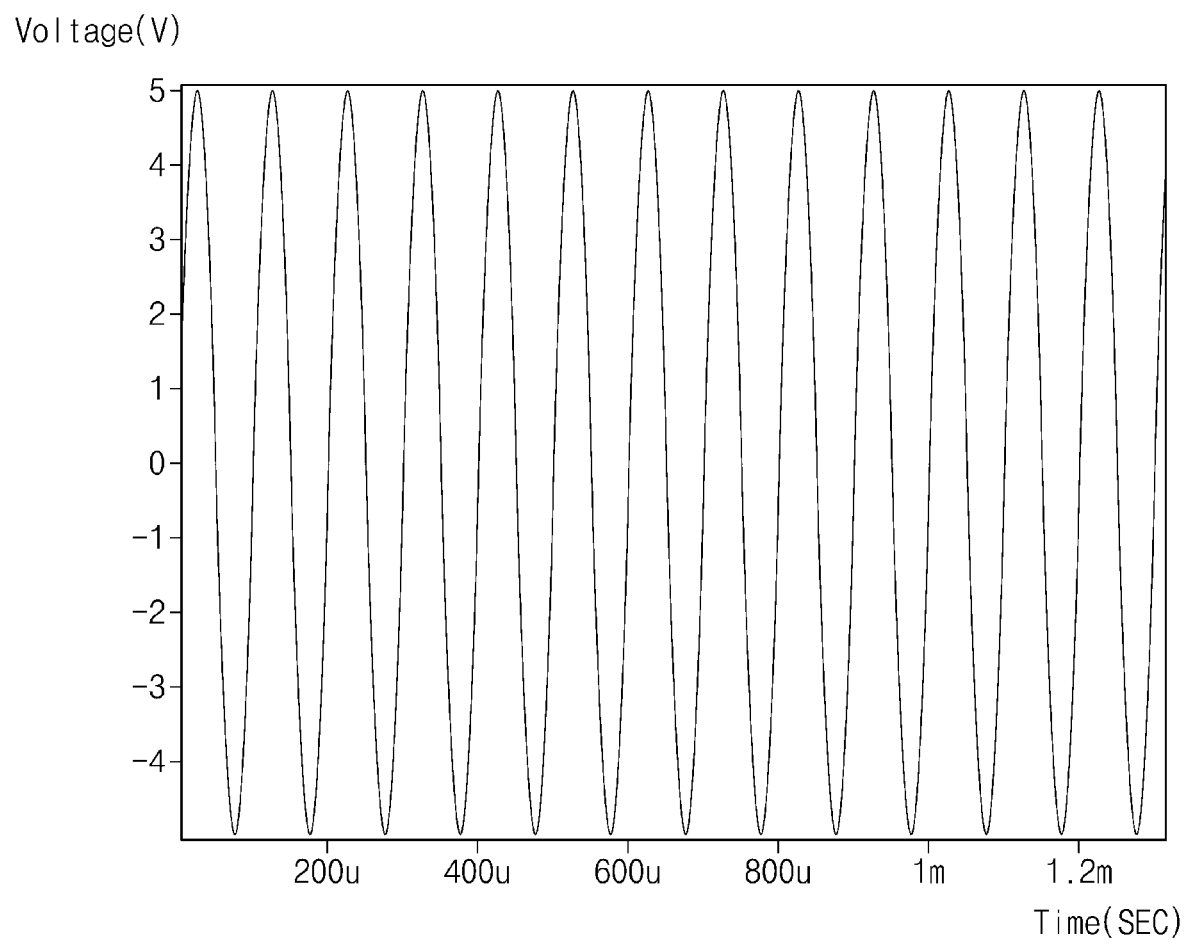
FIG. 7D is a graph illustrating a waveform of a drive signal according to an embodiment of the inventive concept.
Figure 7E:
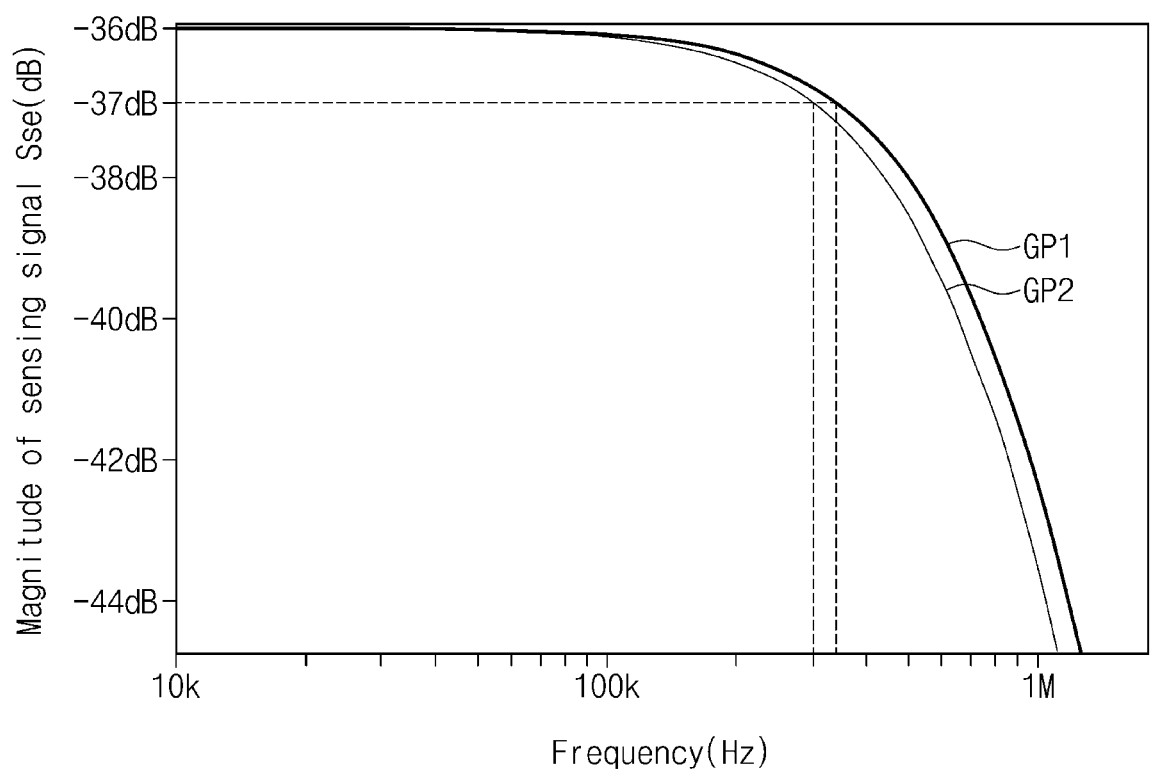
FIG. 7E is a graph illustrating 1 decibel bandwidth characteristic due to a structure of an input sensor.

FIG. 7A is an enlarged planar view of the sensing unit SU according to an embodiment of the inventive concept. FIG. 7B is an enlarged planar view of the intersection region of the sensing unit SU according to an embodiment of the inventive concept. FIG. 7C is an equivalent circuit diagram of an input sensor according to an embodiment of the inventive concept. FIG. 7D is a graph illustrating a waveform of a drive signal according to an embodiment of the inventive concept. FIG. 7E is a graph illustrating 1 decibel (db) bandwidth characteristic due to a structure of the input sensor. Repeated descriptions of substantially the same configurations and elements described above with reference to FIGS. 1 to 6E will be omitted to avoid redundancy.

The sensing unit SU of FIG. 7A may correspond to the sensing unit SU of FIG. 6B. The sensing unit SU includes a first sensor part SP1 and another first sensor part SP1 having a first connection part CP1 therebetween. The sensing unit SU includes a second sensor part SP2 and another second sensor part SP2 having a second connection part CP2 therebetween. As illustrated in FIG. 7A, two first connection parts CP1 may be arranged. Each of the two connection parts CP1 may be a first bridge pattern.

Referring to FIG. 7B, the two first connection parts CP1 connects the two separated first sensor parts SP1. First to fourth connection regions CNT-A1 to CNT-A4 are formed between the two first connection parts CP1 and the two first sensor parts SP1.

Four contact holes CNT-I may be respectively formed in the first to fourth connection regions CNT-A1 to CNT-A4. The first connection region CNT-A1 and the second connection region CNT-A2 may be formed around a second light emission region PXA-B, and the third connection region CNT-A3 and the fourth connection region CNT-A4 may be formed around a first light emission region PXA-R.

The first connection part CP1 intersects with a mesh line of the second sensor part SP2. The first connection part CP1 may partially substitute the mesh line of the second sensor part SP2 in an intersection point. The mesh line of the first connection part CP1 and the mesh line of the second sensor part SP2 may not overlap each other except in intersection points. The mesh line of the first connection part CP1 and the mesh line of the second sensor part SP2 may define an opening replacing the first openings OP-MR, the second openings OP-MB, and the third openings OP-MG.

FIG. 7C illustrates an equivalent circuit of the input sensor between a drive circuit 210 and a sensing circuit 220 according to an embodiment. FIG. 7C illustrates the equivalent circuit on the basis of a reference capacitance Cse formed in an intersection region between one first sensing electrode and one second sensing electrode. Furthermore, in the illustrated embodiment of the inventive concept, a drive signal Sdr is applied to the second sensing electrode through the second signal line. A pad unit PD2 of the second signal line and a pad unit PD1 of the first signal line are exemplarily illustrated in FIG. 7C.

The drive circuit 210 may sequentially provide the drive signal Sdr to the second sensing electrodes IE2-1 to IE2-8 (see FIG. 6B). A sensing signal Sse corresponding to the drive signal Sdr that has passed through the reference capacitance Cse is output through the first sensing electrodes IE1-1 to IE1-10. This sensing signal Sse is input to the sensing circuit 220.

The sensing circuit 220 amplifies, converts, and processes the sensing signal Sse, and detects an external input according to a result of the amplification, conversion, and signal processing. The sensing circuit 220 may include a sensing channel 222, an analog-to-digital converter (ADC) 224, and a processor (or MPU) 226. The sensing channel 222 may be formed for each of the first sensing electrodes IE1-1 to IE1-10. The plurality of sensing channels 222 may be connected to the same ADC 224.

In the illustrated embodiment of the inventive concept, the sensing channel 222 may include an amplifier AMP1, such as an operational amplifier. A first input terminal IN1 of the amplifier AMP1, for example, an inverting input terminal of an operational amplifier, may receive the sensing signal Sse. Furthermore, a second input terminal IN2 of the amplifier AMP1, for example, a non-inverting input terminal of an operational amplifier, is a reference potential terminal and may receive a reference voltage, such as a ground (GND) voltage. A capacitor CC and a reset switch SW may be connected in parallel between the first input terminal IN1 and an output terminal OUT1 of the amplifier AMP1.

The ADC 224 converts an analog signal output from the sensing channel 222 into a digital signal. The processor 226 processes the converted signal (digital signal) from the ADC 224, and detects a touch input according to a result of the signal processing. For example, the processor 226 may comprehensively analyze signals (amplified and converted sensing signals Sse) input via the sensing channel 222 and ADC 224 of each of a plurality of sensing electrodes to detect an occurrence of an external input and a position thereof. The processor 226 may be implemented as a microprocessor MPU in an embodiment. In this case, the sensing circuit 220 may further include a memory required for driving the processor 226. In an embodiment of the inventive concept, the processor 226 may be implemented as a microcontroller.

Although the drive circuit 210 and the sensing circuit 220 are illustrated as being separated, the inventive concepts are not limited thereto. For example, the drive circuit 210 and the sensing circuit 220 may be integrated into a single chip.

Referring to FIG. 7C, a first resistor R-L2 and a second resistor R-E2 are connected in series between the pad unit PD2 of the second signal line and the reference capacitance Cse. The first resistor R-L2 has an equivalent resistance of the second signal line, and the second resistor R-E2 has an equivalent resistance of the second sensing electrode. A first parasitic capacitance C-L2 and a second parasitic capacitance C-E2 are connected between the pad unit PD2 of the second signal line and the reference capacitance Cse. The first parasitic capacitance C-L2 is a capacitance between the second signal line and the second electrode CE (see FIG. 5A), and the second parasitic capacitance C-E2 is a capacitance between the second sensing electrode and the second electrode CE.

Furthermore, a third resistor R-L1 and a fourth resistor R-E1 are connected in series between the pad unit PD1 of the first signal line and the reference capacitance Cse. The third resistor R-L1 has an equivalent resistance of the first signal line, and the fourth resistor R-E1 has an equivalent resistance of the first sensing electrode. A third parasitic capacitance C-L1 and a fourth parasitic capacitance C-E1 are connected between the pad unit PD1 of the first signal line and the reference capacitance Cse. The third parasitic capacitance C-L1 is a capacitance between the first signal line and the second electrode CE, and the fourth parasitic capacitance C-E1 is a capacitance between the first sensing electrode and the second electrode CE (see FIG. 5A).

When a touch event occurs, the reference capacitance Cse of a corresponding position may be changed. Due to the occurrence of the touch event, a touch capacitance connected in parallel to the reference capacitance Cse is generated. The processor 226 may measure a capacitance variation ΔCm generated after the occurrence of the touch event from the sensing signal Sse. The capacitance variation ΔCm may be measured by sensing a change in a current of the sensing signal Sse.

FIG. 7D illustrates a waveform of a sinusoidal signal as a drive signal. In FIG. 7E, a first graph GP1 represents 1 decibel bandwidth characteristic of the input sensor according to an embodiment, and a second graph GP2 represents the 1 decibel bandwidth characteristic of an input sensor according to a comparative example. FIG. 7E illustrates the 1 decibel bandwidth characteristic measured from a sensing signal corresponding to the drive signal illustrated in FIG. 7D. The x-axis of FIG. 7E is illustrated in log scale.

The 1 decibel bandwidth characteristic was measured on an input sensor having eight sensing units SU (see FIG. 6B) arranged in a sensing unit row, and 17 sensing units arranged in a sensing unit column. According to the illustrated embodiment of the inventive concept, the second sensing electrode has a single body shape, and the first bridge patterns are arranged in the first sensing electrode, as illustrated in FIGS. 6B to 7B. According to the comparative example, the first sensing electrode has a single body shape, and the first bridge patterns are arranged in the second sensing electrode.

On the basis of the equivalent circuit of FIG. 7C, the illustrated embodiment includes 8 first bridge patterns, and the comparative examples includes 17 first bridge patterns. A total resistance of the second resistor R-E2 and the fourth resistor R-E1 according to the illustrated embodiment was measured as about 649 ohms, and a total resistance of the second resistor R-E2 and the fourth resistor R-E1 according to the comparative example was measured as about 692 ohms. The illustrated embodiment has a relatively low total resistance in comparison with the comparative example due to fewer first bridge patterns, which have a high contact resistance. In the illustrated embodiment and the comparative example, the first resistor R-L2, the third resistor R-L1, and the first to fourth parasitic capacitances C-L2, C-E2, C-L1, and C-E1 are substantially the same.

The 1 decibel bandwidth of the first graph GP1 was measured as about 340 k, and the 1 decibel bandwidth of the second graph GP2 was measured as bout 290 k. The illustrated embodiment of the inventive concept has a relatively low total resistance in comparison with the comparative example, and thus has excellent 1 decibel bandwidth characteristic and a wider bandwidth of an alternating current signal. The wide bandwidth of an alternating current signal may improve the sensitivity of the input sensor that uses a sinusoidal signal as a drive signal.

Figure 8A:
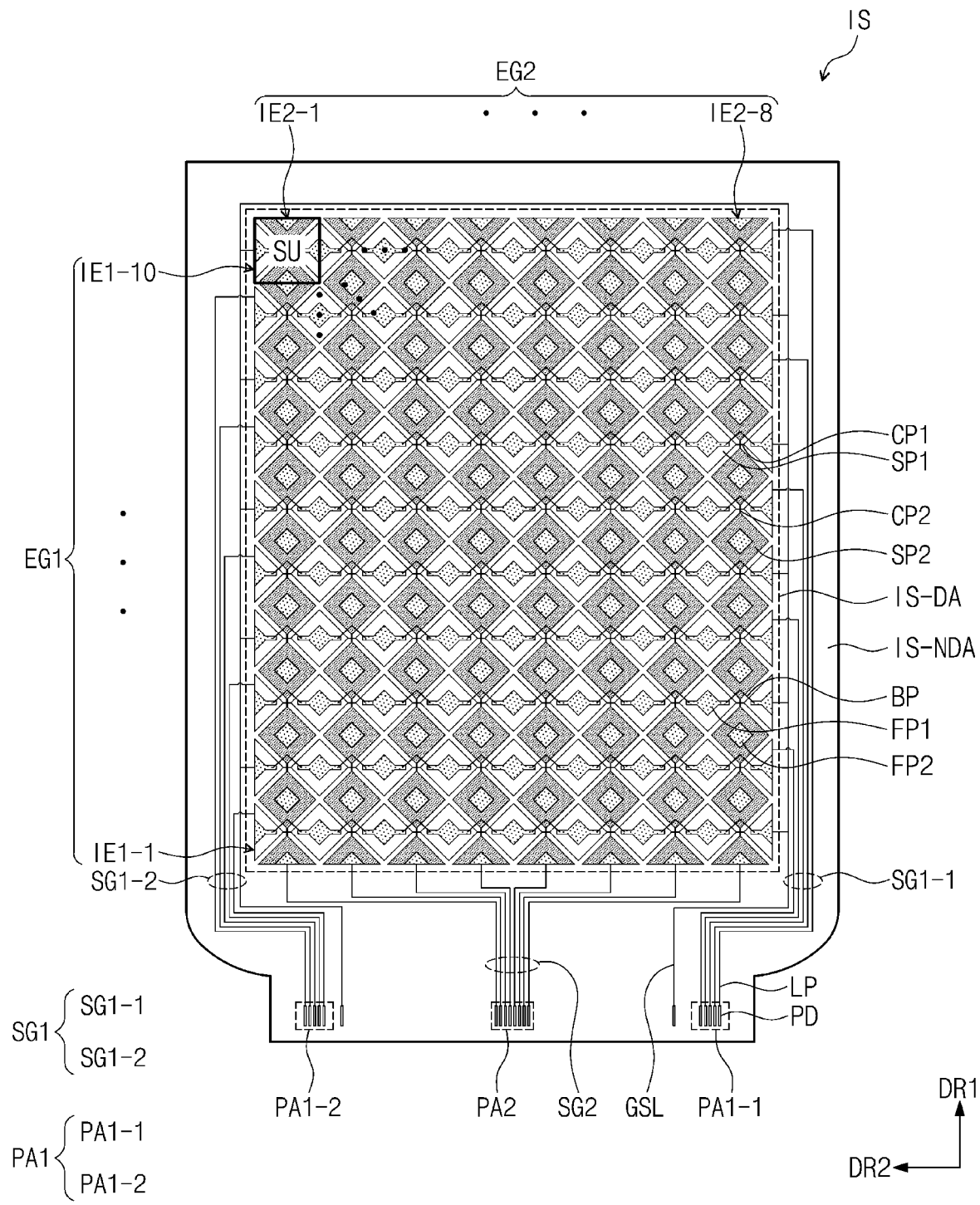
FIG. 8A is a planar view of an input sensor according to an embodiment of the inventive concept.
Figure 8B:
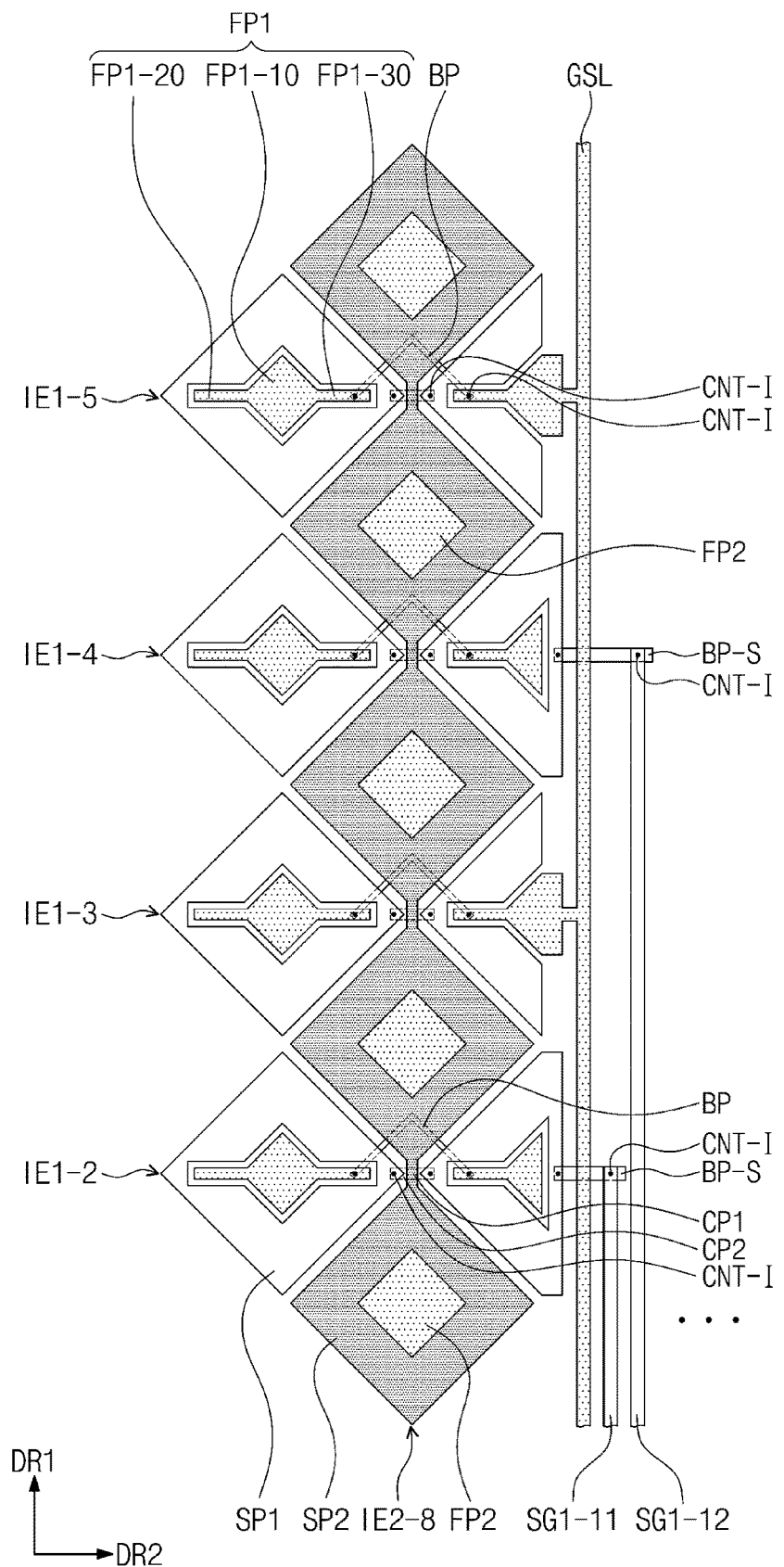
FIG. 8B is a partial planar view of an input sensor according to an embodiment of the inventive concept.
Figure 8C:
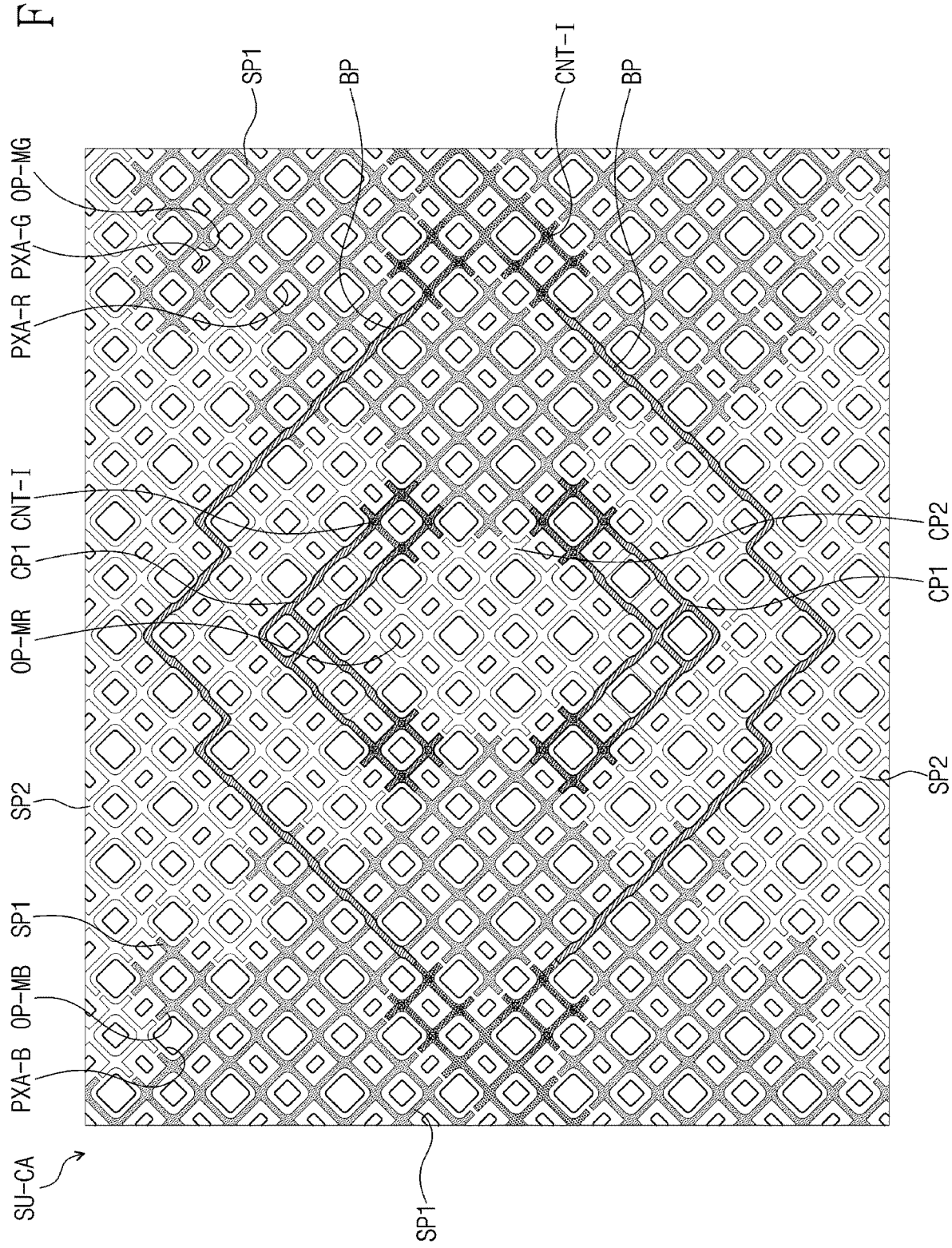
FIG. 8C is an enlarged planar view of an intersection region of an input sensor according to an embodiment of the inventive concept.
Figure 8D:
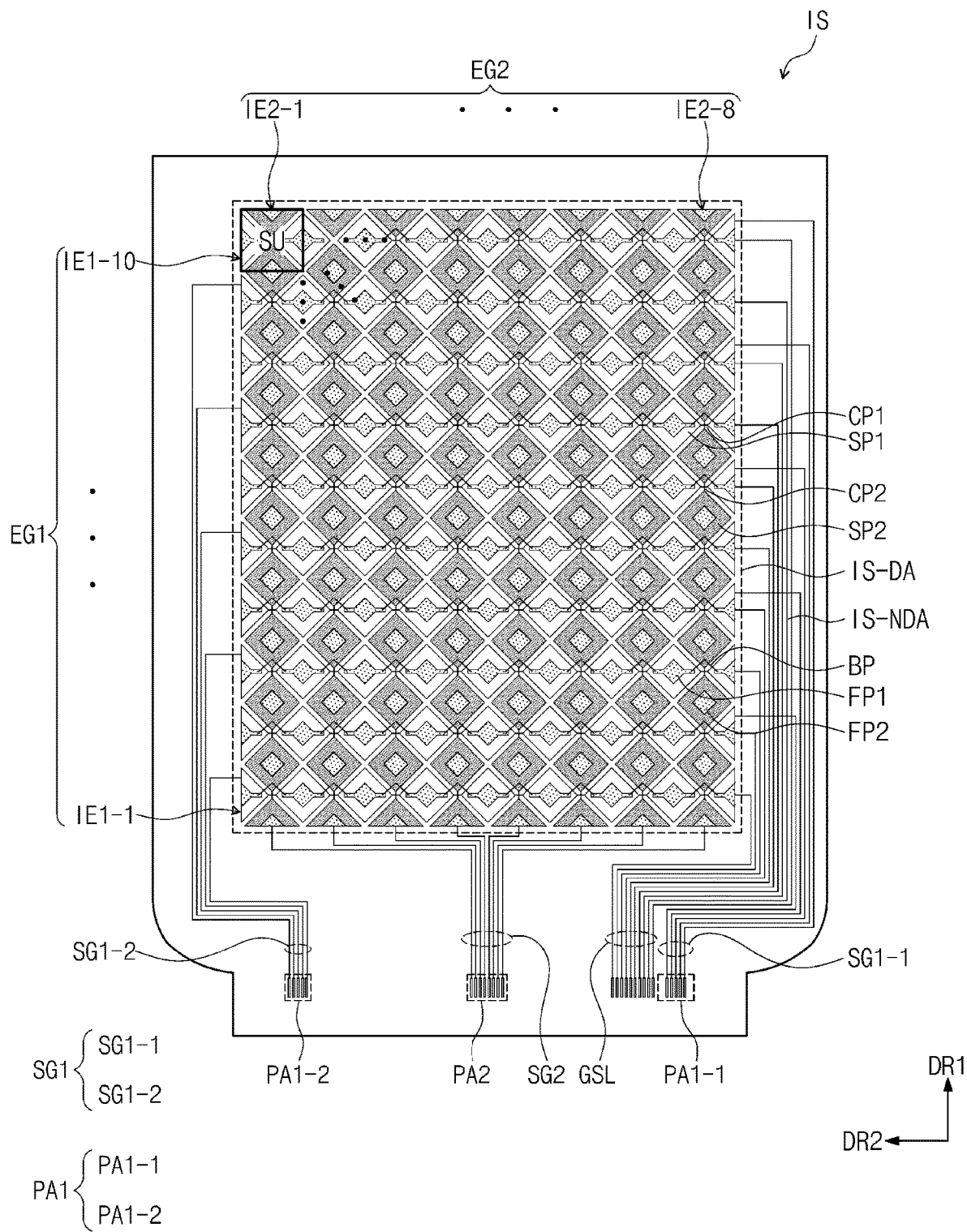
FIG. 8D is a planar view of an input sensor according to an embodiment of the inventive concept.

FIG. 8A is a planar view of an input sensor IS according to an embodiment of the inventive concept. FIG. 8B is an enlarged planar view of a partial region of FIG. 8A. FIG. 8C is an enlarged planar view of an intersection region according to an embodiment of the inventive concept. FIG. 8D is a planar view of an input sensor IS according to an embodiment of the inventive concept. Repeated descriptions of the substantially same configurations and elements as described above with reference to FIGS. 6A to 7E will be omitted to avoid redundancy.

As illustrated in FIG. 8A, the input sensor IS may further include first dummy patterns FP1 arranged inside the first sensor parts SP1 and insulated from the first sensor parts SP1, and second dummy patterns FP2 arranged inside the second sensor parts SP2 and insulated from the second sensor parts SP2. The first dummy patterns FP1 and the second dummy patterns FP2 may reduce a parasitic capacitance between the input sensor IS and a display panel (for example, see FIG. 6A), for example, the second parasitic capacitance C-E2 and the fourth parasitic capacitance C-E1 of FIG. 7C. In this manner, due to the reduced parasitic capacitance, the sensitivity of the input sensor IS may be improved.

The input sensor IS may further include bridge patterns BP (hereinafter referred to as "second bridge patterns") connecting the first dummy patterns FP1. The second bridge patterns BP may be formed from the first conductive layer IS-CL1 illustrated in FIG. 6A. The second bridge patterns BP are arranged in correspondence with intersection regions. The second bridge patterns BP may overlap the second sensor part SP2. The second bridge patterns BP may be arranged on the same layer as the first bridge patterns CP1 (see FIG. 7B).

As illustrated in FIG. 8A, the input sensor IS may further include a dummy signal line GSL. The dummy signal line GSL may receive a predetermined bias voltage, for example, a ground voltage. The dummy signal line GSL may be connected to the first dummy patterns FP1. The dummy signal line GSL may be formed from the second conductive layer IS-CL2 illustrated in FIG. 6A.

In an embodiment of the inventive concept, the dummy signal line GSL may be connected to the sensing circuit 220 (see FIG. 7C). The dummy signal line GSL may be electrically connected to the second input terminal IN2 of the amplifier AMP1 (see FIG. 7C). In this case, the first dummy patterns FP1 may have a noise detection function. As such, the sensing signal Sse may be processed to reflect the noise that affects the first dummy patterns FP1.

FIG. 8B illustrates an enlarged view of a part of four first sensing electrodes IE1-2 to IE1-5 and the rightmost second sensing electrode IE2-8 according to an embodiment. The dummy signal line GSL may be electrically connected to the first dummy patterns FP1 arranged inside odd-numbered first sensing electrodes IE1-3 and IE1-5. The dummy signal line GSL may be directly connected to an outermost first dummy pattern FP1 among the first dummy patterns FP1 in substantially the second direction DR2. In an embodiment of the inventive concept, the dummy signal line GSL may be connected to the first dummy patterns FP1 through a bridge pattern.

As illustrated in FIG. 8B, at least one of the first dummy patterns FP1 may include extension parts FP1-20 and FP1-30 arranged on both sides of a center part FP1-10 substantially in the second direction DR2. Each of the extension parts FP1-20 and FP1-30 is connected to a corresponding second bridge pattern BP. Some of the first dummy patterns FP1 arranged on both ends in the second direction DR2 may have a shape that is different from the shape of the other first dummy patterns FP1. For example, the first dummy patterns FP1 arranged on both ends may include a center part and one extension part disposed on one side of the center part.

As illustrated in FIG. 8B, the input sensor IS may further include bridge patterns BP-S (hereinafter "third bridge patterns") that may intersect the dummy signal line GSL and insulate from the dummy signal line GSL. The third bridge patterns BP-S may connect the first sensing electrodes IE1-2 and IE1-4 and the signal lines SG1-11 and SG1-12. The third bridge patterns BP-S may be formed from the first conductive layer IS-CL1 illustrated in FIG. 6A.

FIG. 8C is an enlarged view of one intersection region SU-CA according to an embodiment of the inventive concept. The region illustrated in FIG. 8C corresponds to the region illustrated in FIG. 7B. Unlike FIGS. 8A and 8B, FIG. 8C illustrates two bridge patterns BP being arranged in the intersection region SU-CA according to an embodiment. The second bridge patterns BP may be arranged in correspondence with the first bridge patterns CP1.

The two second bridge patterns BP may be arranged outside the two first bridge patterns CP1. The second bridge patterns BP may have a greater length than the first bridge patterns CP1. Four connection regions may be formed between the two second bridge patterns BP and the two first dummy patterns FP1. Four contact holes CHT-I may be respectively arranged in the four connection regions.

As illustrated in FIG. 8D, a plurality of dummy signal lines GSL may be provided. In the illustrated embodiment, the same number of the dummy signal lines GSL may be arranged as the first sensing electrodes IE1-1 to IE1-10. Each of the dummy signal lines GSL may be connected to the first dummy pattern FP1 adjacent to a corresponding first sensing electrode. The dummy signal lines GSL may be connected to the sensing channels 222 corresponding to the first sensing electrodes IE1-1 to IE1-10 and the second input terminal IN2 of the amplifier AMP1.

Figure 9A:
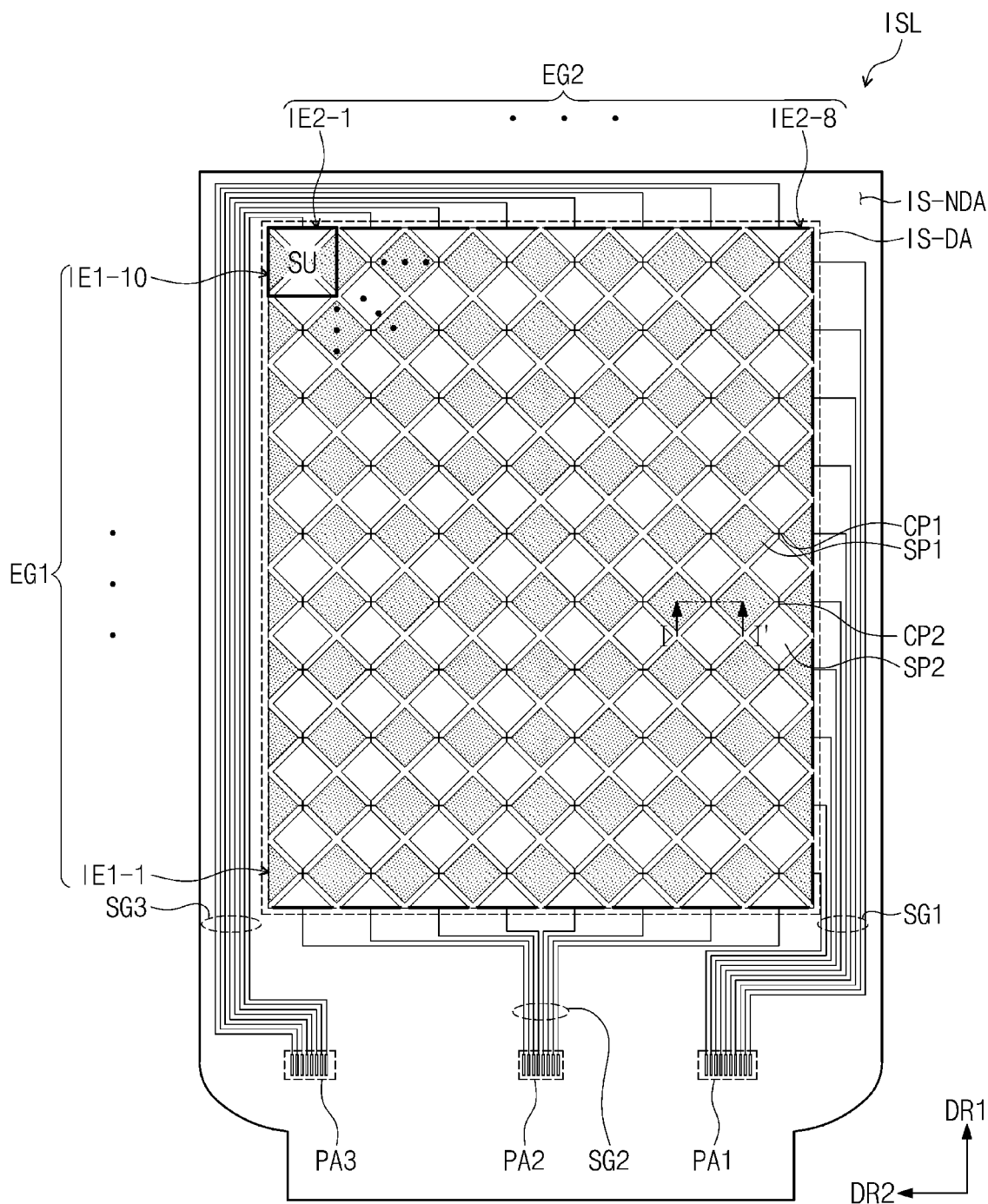
FIG. 9A is a planar view of an input sensor according to an embodiment of the inventive concept.
Figure 9B:
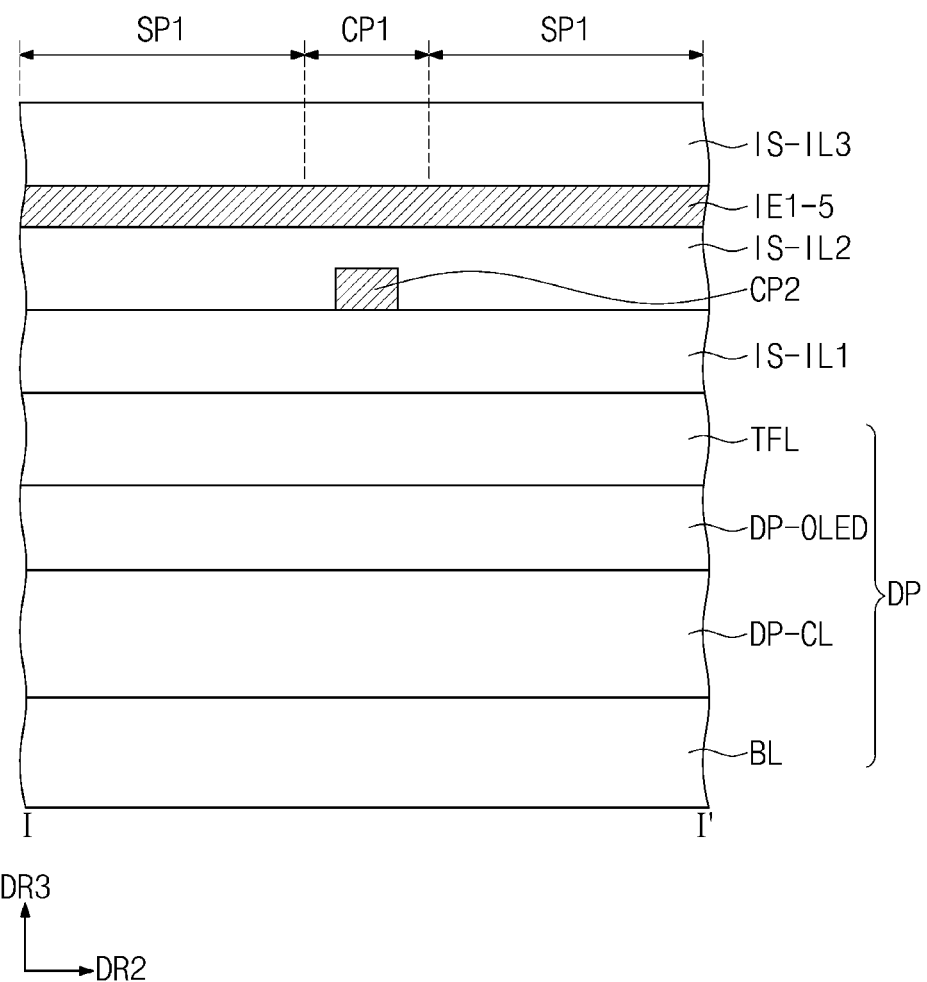
FIG. 9B is a partial planar view of an input sensor according to an embodiment of the inventive concept.
Figure 9C:
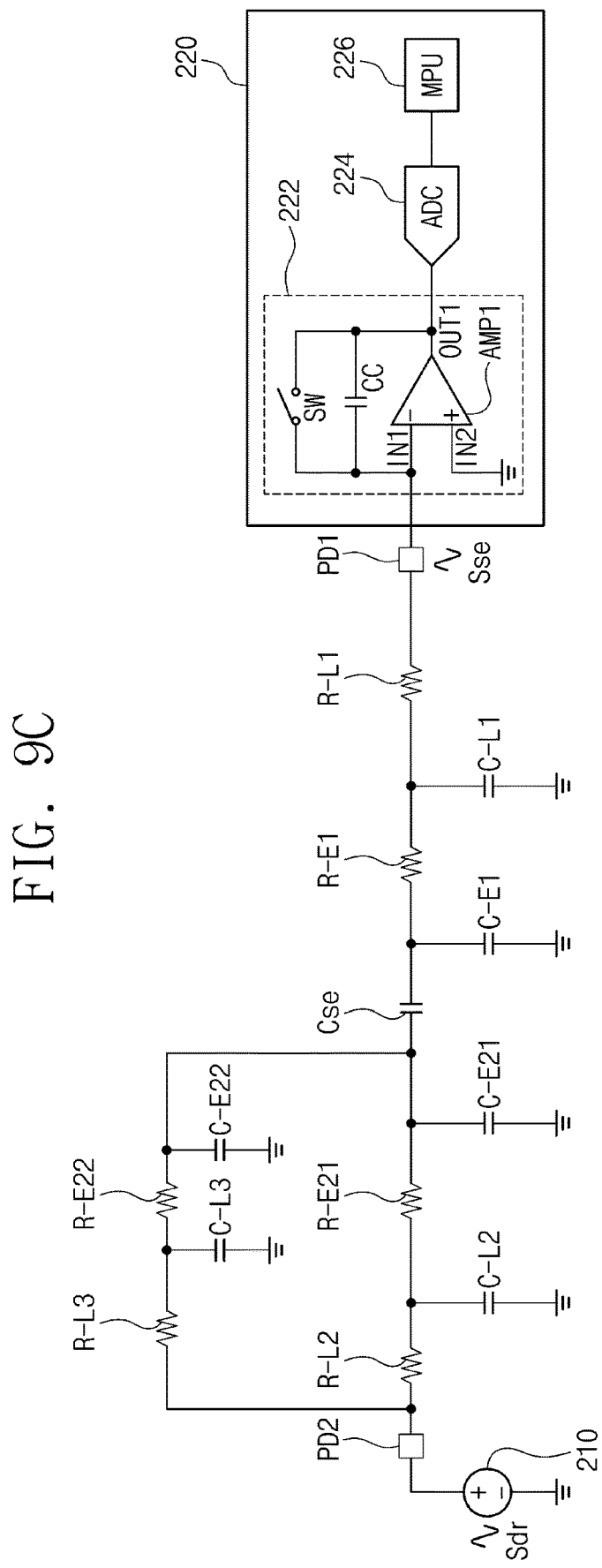
FIG. 9C is an equivalent circuit diagram of an input sensor according to an embodiment of the inventive concept.

FIG. 9A is a planar view of the input sensing layer ISL according to an embodiment of the inventive concept. FIG. 9B is a partial cross-sectional view of the input sensing layer ISL according to an embodiment of the inventive concept. FIG. 9C is an equivalent circuit diagram of the input sensing layer ISL according to an embodiment of the inventive concept. Repeated descriptions of substantially the same configurations and elements as described above with reference to FIGS. 1 to 8D will be omitted to avoid redundancy.

As compared to the input sensing layer ISL of FIG. 6B, the input sensing layer ISL according to the illustrated embodiment of the inventive concept further includes a third signal line group SG3. Furthermore, the input sensing layer ISL according to the illustrated embodiment of the inventive concept has a different connection relationship between the first electrode group EG1 and second electrode group EG2 and the first signal line group SG1 and second signal line group SG2, as compared to those of the input sensing layer ISL of FIG. 6B.

In particular, one right ends of the first sensing electrodes IE1-1 to IE1-10 are connected to the signal lines of the first signal line group SG1. One lower ends of the second sensing electrodes IE2-1 to IE2-8 are connected to the signal lines of the second signal line group SG2. One upper ends of the second sensing electrodes IE2-1 to IE2-8 are connected to the signal lines of the third signal line group SG3. As such, according to an embodiment, both ends of the second sensing electrodes IE2-1 to IE2-8 are connected to signal lines. This connection relationship between the signal lines and the sensing electrodes is referred to as a double routing structure.

Furthermore, according to an embodiment of the inventive concept, the first bridge pattern is applied to the second sensing electrodes IE2-1 to IE2-8 that have a greater length. In particular, the second connection part CP2 may correspond to the first bridge pattern. Each of the first sensing electrodes IE1-1 to IE1-10 may have a single body shape.

As illustrated in FIG. 9B, the first sensor parts SP1 and the first connection part CP1 may be arranged on the same layer and may be formed as a single body. The first sensor parts SP1 and the first connection part CP1 may be are formed from the second conductive layer CL2 of FIG. 6A through substantially the same process. The second connection part CP2 may connect the second sensor parts SP2 through contact holes CHT-I penetrating the second insulating layer IS-IL2.

Referring to the equivalent circuit of FIG. 9C, the drive signal Sdr is provided to both ends of the second sensing electrode through a second signal line and a signal line of the third signal line group SG3 (hereinafter referred to as a "third signal line")

A second resistor R-E21 of the double routing structure has a lower resistance than the second resistor R-E2 of FIG. 7C. This is because the second resistor R-E21 corresponds to a part of the second sensing electrode. However, the double routing structure further includes a fifth resistor R-L3 and a sixth resistor R-E22 connected in parallel to the first resistor R-L2 and the second resistor R-E21. The fifth resistor R-L3 has an equivalent resistance of the third signal line. The sixth resistor R-E22 corresponds to a part of the second sensing electrode, and the total resistance of the second resistor R-E21 and the sixth resistor R-E22 corresponds to the second resistor R-E2 of FIG. 7C.

In FIG. 9C, a fifth parasitic capacitance C-L3 is a capacitance between the third signal line and the second electrode CE (see FIG. 5A), and a sixth parasitic capacitance C-E22 is a capacitance between a part of the second sensing electrode and the second electrode CE. A second parasitic capacitance C-E21 is a capacitance between the other part of the second sensing electrode and the second electrode CE, and is thus smaller than the second parasitic capacitance C-E2 of FIG. 7C.

In FIG. 9C, it may be desirable that the second resistor R-E21 and the sixth resistor R-E22 have a relatively large value so that the total resistance between the pad unit PD2 of the second signal line and the reference capacitance Cse has a low value. As illustrated in FIGS. 9A and 9B, the values of the second resistor R-E21 and the sixth resistor R-E22 may be relatively increased by applying the first bridge pattern to the second connection part CP2. Furthermore, since the first sensing electrode has a single body shape, the value of the fourth resistor R-E1 may be reduced. As such, by reducing an overall total resistance, the bandwidth characteristic of the input sensing layer ISL having the double routing structure may be improved.

Figure 10A:
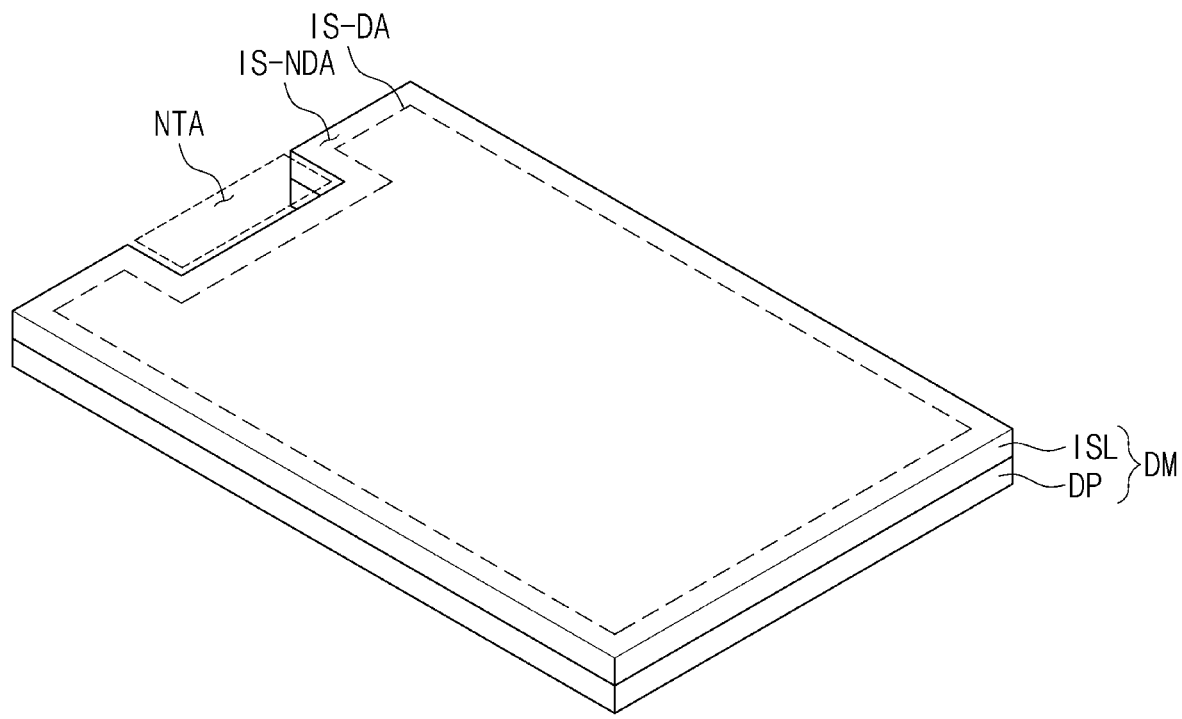
FIG. 10A is a perspective view of a display module according to an embodiment of the inventive concept.
Figure 10B:
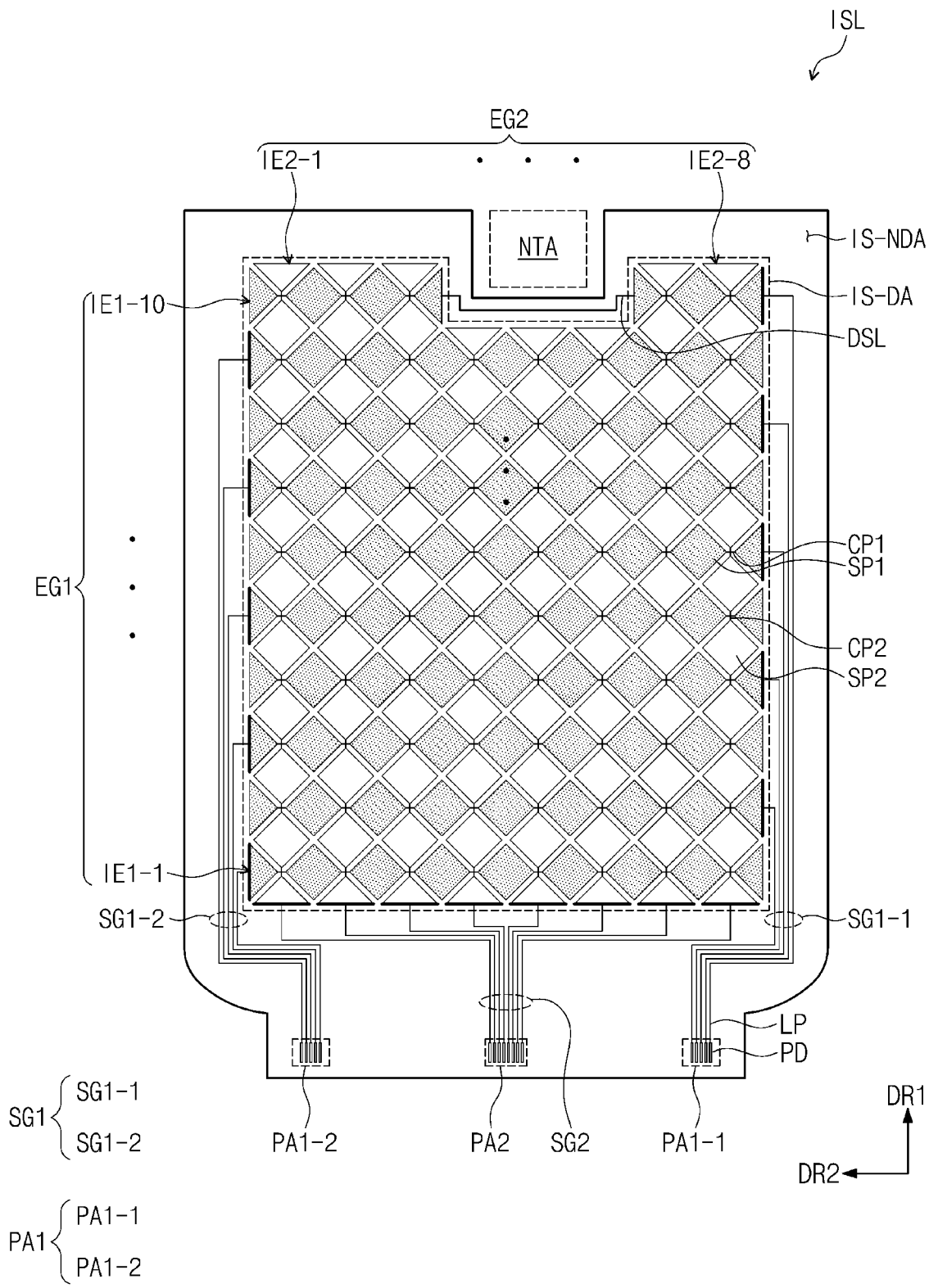
FIG. 10B is a planar view of an input sensing layer according to an embodiment of the inventive concept.
Figure 11A:
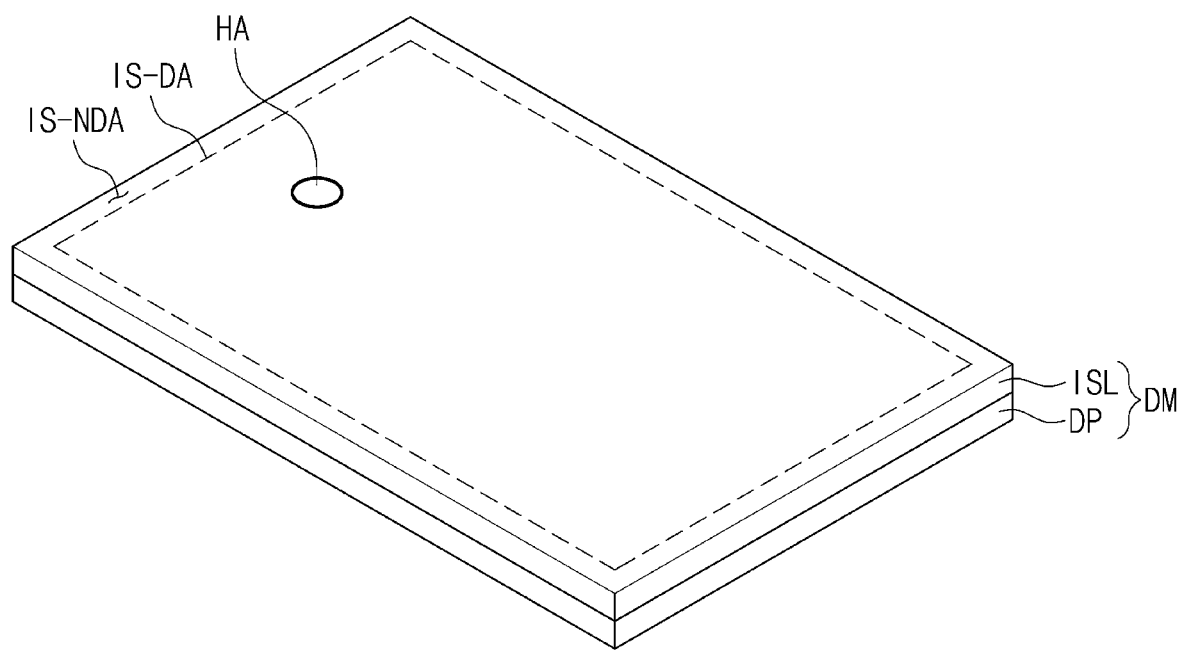
FIG. 11A is a perspective view of a display module according to an embodiment of the inventive concept.
Figure 11B:
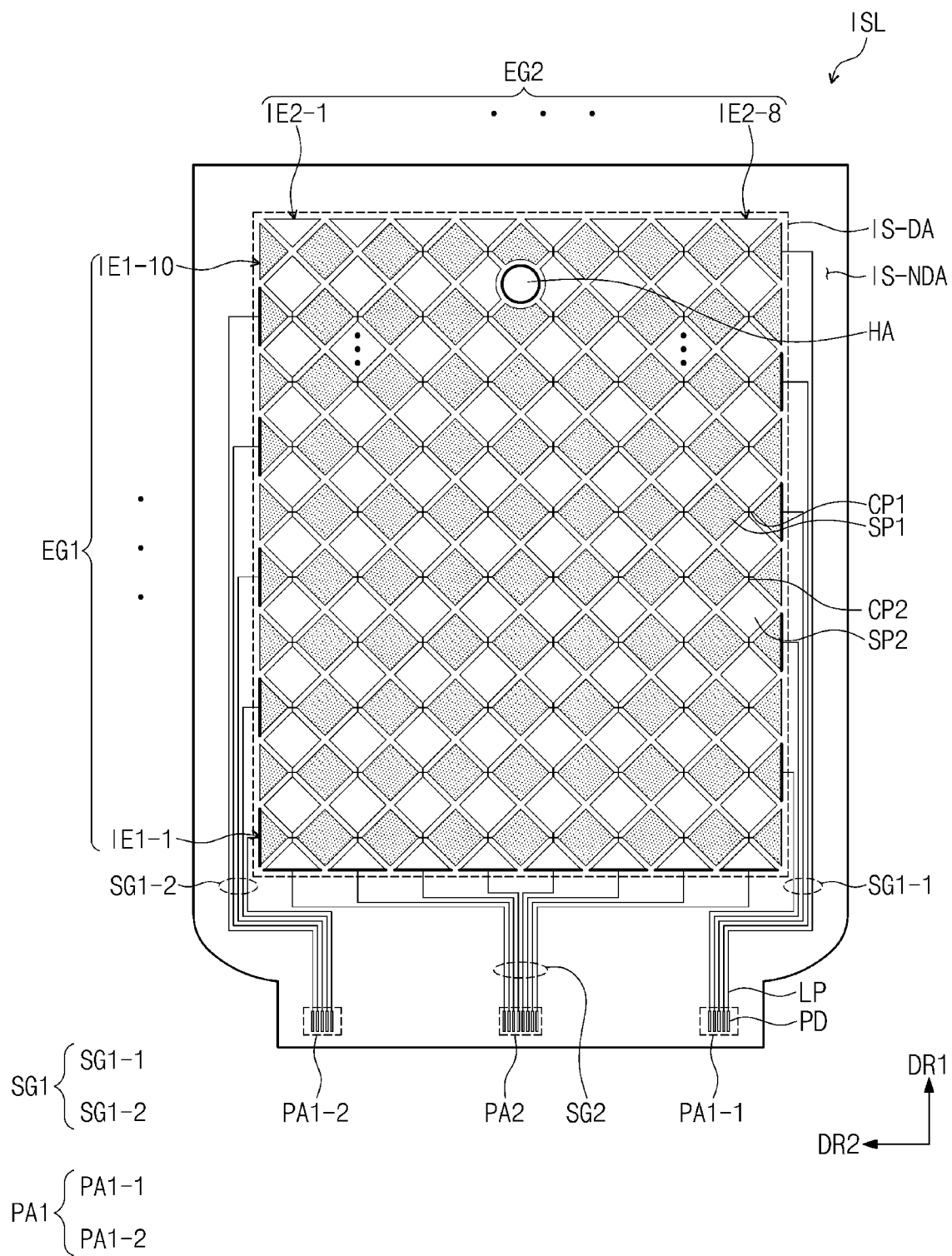
FIG. 11B is a planar view of an input sensing layer according to an embodiment of the inventive concept.

FIG. 10A is a perspective view of a display module DM according to an embodiment of the inventive concept. FIG. 10B is a planar view of the input sensing layer ISL according to an embodiment of the inventive concept. FIG. 11A is a perspective view of the display module DM according to an embodiment of the inventive concept. FIG. 11B is a planar view of the input sensing layer ISL according to an embodiment of the inventive concept. Repeated descriptions of substantially the same configurations and elements as described above with reference to FIGS. 1 to 9C will be omitted to avoid redundancy.

Referring the FIG. 10A, the display module DM may include a notch region NTA which is recessed inwardly in a planar view. The notch region NTA may be defined in each of the display panel DP and the input sensing layer ISL, but the notch regions NTA may or may not be identical. The notch region NTA may be defined in a center region in the second direction DR2. In some embodiments, the notch region NTA may not be disposed in an exact center region.

As illustrated in FIG. 10B, shapes of the first electrode group EG1 and the second electrode group EG2 may be changed due to the notch region NTA. The positions and arrangement of the first signal line group SG1 and the second signal line group SG2 may be substantially the same as those of the input sensing layer ISL of FIG. 6B.

As illustrated in FIG. 10B, the 10th electrode IE1-10 may be divided into two parts due to the notch region NTA. The two parts may be connected by a dummy connection line DSL. The fourth to sixth electrodes IE2-4 to IE2-6 of the second electrode group EG2 may have a shorter length than the other electrodes.

As illustrated in FIG. 11A, the display module DM according to an embodiment may include a signal transmission region HA in a planar view. The signal transmission region HA may be defined by partially or completely removing partial regions of the display panel DP and the input sensing layer ISL. The signal transmission region HA may be divided into a region having a first transmittance and another region having a second transmittance lower than the first transmittance. For example, either the display panel DP or the input sensing layer ISL may be removed in the region having the second transmittance, and both the display panel DP and the input sensing layer ISL may be removed in the region having the first transmittance. For example, light-emitting elements of the display panel DP may be partially removed in the region having the second transmittance, and may be completely removed in the region having the first transmittance.

The signal transmission region HA of the display panel DP and the signal transmission region HA of the input sensing layer ISL may or may not be identical. The signal transmission region HA may be a transfer passage of an optical signal. A plurality of the signal transmission regions HA may be defined in the display module DM.

The signal transmission region HA of the display panel DP is formed by removing at least a part of a base layer BL, a circuit element layer DP-CL, a display element layer DP-OLED, and an upper insulating layer TFL disposed on the base layer BL. The sensor parts SP1 and SP2 may be removed from the signal transmission region HA of the input sensing layer ISL.

As illustrated in FIG. 11B, the shapes of the first electrode group EG1 and the second electrode group EG2 may be changed due to the signal transmission region HA. The positions and arrangement of the first signal line group SG1 and the second signal line group SG2 may be substantially the same as those of the input sensing layer ISL of FIG. 6B.

The signal transmission region HA of the input sensing layer ISL may be disposed in an intersection region between the first electrode group EG1 and the second electrode group EG2. Here, a dummy connection line may be disposed around the signal transmission region HA of the input sensing layer ISL. For example, the dummy connection line may detour around the signal transmission region HA to connect the separated electrodes of the first electrode group EG1 and the second electrode group EG2.

According to an embodiment of the inventive concept, a position of a connection part (or bridge pattern) relative to a sensor part is changed according to a connection structure of a signal line and a sensing electrode. In particular, according to the connection structure of the signal line and the sensing electrode, a bridge pattern is disposed in either the first sensing electrode or the second sensing electrode.

According to embodiments of the inventive concept, since the resistance of an input sensor is reduced, the AC bandwidth characteristics may be improved. Since the bandwidth of a sensing signal increases, the sensing sensitivity may be improved.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a display panel comprising a base layer, a circuit element layer disposed on the base layer, a display element layer disposed on the circuit element layer, and an upper insulating layer disposed on the display element layer; and
   an input sensor disposed on the display panel and including a sensing region and a wiring region outside the sensing region, the input sensor comprising:
      a first sensing electrode disposed in the sensing region extended along a second direction;
      a second sensing electrode disposed in the sensing region extended along a first direction crossing the second direction;
      a first signal line electrically connected to a first end of the first sensing electrode, a second end of the first sensing electrode opposite to the first end of the first sensing electrode in the second direction is electrically isolated;
      a second signal line electrically connected to a first end of the second sensing electrode; and
      a third signal line electrically connected to a second end of the second sensing electrode opposite to the first end of the second sensing electrode in the first direction,
   wherein a total distance between the first end and the second end of the second sensing electrode is greater than a total distance between the first end and the second end of the first sensing electrode,
   the first sensing electrode has a single body shape,
   the second sensing electrode comprises sensor parts formed from a same layer as the first sensing electrode and bridge patterns formed from a different layer from the sensor parts, the sensor parts arranged in the first direction, and each of the bridge patterns connects two neighboring sensor parts among the sensor parts,
   the display device further includes a signal transmission region in which at least a part of the base layer, the circuit element layer, the display element layer, and the upper insulating layer is removed, and
   each of the first end and the second end of the second sensing electrode is configured to receive a sinusoidal signal.

2. The display device of claim 1, wherein the first sensing electrode is configured to provide a sensing signal corresponding to the sinusoidal signal to a sensing circuit.

3. The display device of claim 1, wherein:
   the display panel comprises a display region corresponding to the sensing region and a non-display region corresponding to the wiring region;
   the display region comprises light emission regions and non-light emission regions; and
   the first sensing electrode has openings that correspond to the light emission regions.

4. The display device of claim 1, wherein the first sensing electrode and the second sensing electrode are formed from a same layer.

5. The display device of claim 1, wherein the input sensor further comprises an insulating layer disposed between the bridge patterns and the sensor parts.

6. The display device of claim 1, wherein the display device further includes a notch region recessed inwardly in a plan view.

7. The display device of claim 1, wherein the input sensor is directly disposed on the display panel.

* * * * *